(12) United States Patent
Kimura

(10) Patent No.: US 7,973,471 B2
(45) Date of Patent: Jul. 5, 2011

(54) LIGHT EMITTING DEVICE COMPRISING TRANSPARENT PROTRUSION, FIRST AND SECOND ELECTRODES AND ORGANIC LAYER

(75) Inventor: Hajime Kimura, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 349 days.

(21) Appl. No.: 12/055,412

(22) Filed: Mar. 26, 2008

(65) Prior Publication Data

US 2008/0211396 A1    Sep. 4, 2008

Related U.S. Application Data

(60) Continuation of application No. 10/754,542, filed on Jan. 12, 2004, now Pat. No. 7,427,223, and a division of application No. 10/061,018, filed on Jan. 29, 2002, now Pat. No. 6,717,359.

(30) Foreign Application Priority Data

Jan. 29, 2001 (JP) ................................. 2001-019696

(51) Int. Cl.
  *H01L 51/00* (2006.01)
(52) U.S. Cl. ........................................ 313/506; 313/504
(58) Field of Classification Search ........... 313/498–512
  See application file for complete search history.

(56) References Cited

U.S. PATENT DOCUMENTS

| | | | |
|---|---|---|---|
| 4,728,581 A | 3/1988 | Kane | |
| 4,774,435 A | 9/1988 | Levinson | |
| 5,429,884 A * | 7/1995 | Namiki et al. | 428/690 |
| 5,485,055 A | 1/1996 | Keyser | |
| 5,530,269 A | 6/1996 | Tang | |
| 5,550,066 A | 8/1996 | Tang | |
| 5,684,365 A | 11/1997 | Tang | |
| 5,734,452 A | 3/1998 | Yamaue | |
| 5,834,894 A | 11/1998 | Shirasaki | |
| 5,929,474 A | 7/1999 | Huang | |
| 6,072,278 A | 6/2000 | Keyser | |
| 6,091,078 A | 7/2000 | Codama | |
| 6,120,338 A | 9/2000 | Hirano | |
| 6,121,726 A | 9/2000 | Codama | |
| 6,215,244 B1 | 4/2001 | Kuribayashi | |
| 6,217,183 B1 | 4/2001 | Shipman | |
| 6,219,113 B1 | 4/2001 | Takahara | |
| 6,246,179 B1 | 6/2001 | Yamada | |
| 6,330,461 B1 | 12/2001 | Andersson | |
| 6,366,025 B1 | 4/2002 | Yamada | |
| 6,396,208 B1 | 5/2002 | Oda | |

(Continued)

FOREIGN PATENT DOCUMENTS

| | | |
|---|---|---|
| EP | 0 849 979 | 6/1998 |
| EP | 0 935 229 | 8/1999 |
| EP | 1 505 650 | 2/2005 |
| EP | 1 505 651 | 2/2005 |
| EP | 1 505 652 | 2/2005 |
| JP | 07-442169 | 6/1995 |
| JP | 08-083688 | 3/1996 |
| JP | 10-177895 | 6/1998 |
| JP | 10-208875 | 8/1998 |
| JP | 11-024606 | 1/1999 |
| JP | 11-214162 | 8/1999 |
| JP | 11-354271 | 12/1999 |
| JP | 11-354279 | 12/1999 |
| JP | 2000-040584 | 2/2000 |
| JP | 2000-284705 | 10/2000 |
| WO | WO 9901856 A1 * | 1/1999 |

*Primary Examiner* — Anne M Hines
(74) *Attorney, Agent, or Firm* — Fish & Richardson P.C.

(57) ABSTRACT

There is provided a method for manufacturing a light emitting device in which no copy-in is caused in the case of a light emitting device having a glossy cathode. An uneven portion is formed on the surface of a cathode which is in contact with an organic layer in a pixel portion, and incident light is reflected in all directions. An insulating film having a high light absorption property is formed in a driver circuit portion, and the copy-in becomes invisible to the observer.

28 Claims, 16 Drawing Sheets

U.S. PATENT DOCUMENTS

| | | | |
|---|---|---|---|
| 6,429,584 B2 | 8/2002 | Kubota | |
| 6,433,487 B1 | 8/2002 | Yamazaki | |
| 6,476,550 B1 * | 11/2002 | Oda et al. | 313/504 |
| 6,515,310 B2 | 2/2003 | Yamazaki | |
| 6,515,428 B1 | 2/2003 | Yeh | |
| 6,522,066 B2 | 2/2003 | Sheu | |
| 6,522,079 B1 | 2/2003 | Yamada | |
| 6,542,207 B1 | 4/2003 | Yoshizawa | |
| 6,555,969 B2 | 4/2003 | Yamazaki | |
| 6,583,805 B2 | 6/2003 | Mashimo | |
| 6,597,121 B2 | 7/2003 | Imura | |
| 6,618,029 B1 * | 9/2003 | Ozawa | 345/82 |
| 6,650,045 B1 | 11/2003 | Forrest | |
| 6,717,359 B2 | 4/2004 | Kimura | |
| 7,012,300 B2 | 3/2006 | Yamazaki | |
| 2001/0004190 A1 | 6/2001 | Nishi | |
| 2001/0055841 A1 | 12/2001 | Yamazaki | |
| 2003/0151568 A1 | 8/2003 | Ozawa | |
| 2003/0193493 A1 | 10/2003 | Ozawa | |
| 2005/0052371 A1 | 3/2005 | Ozawa | |

* cited by examiner

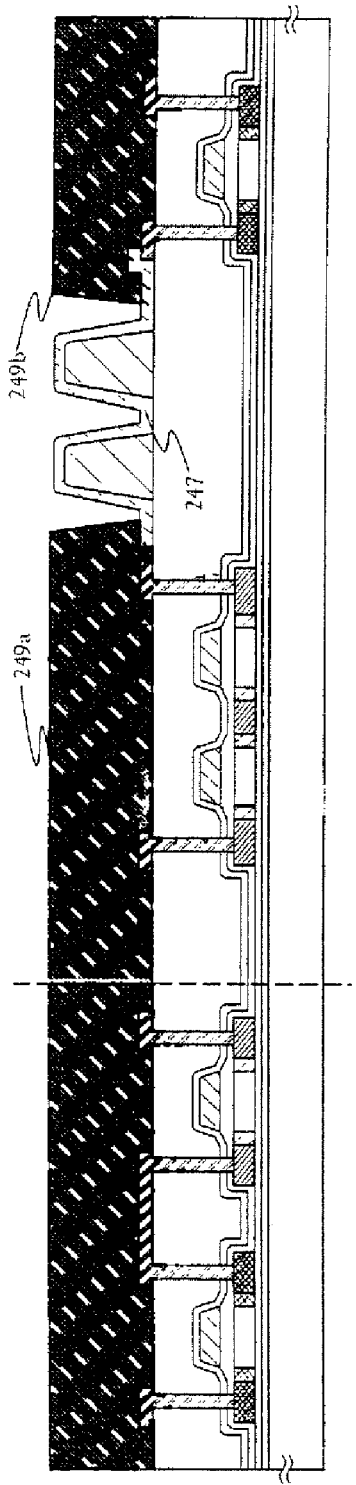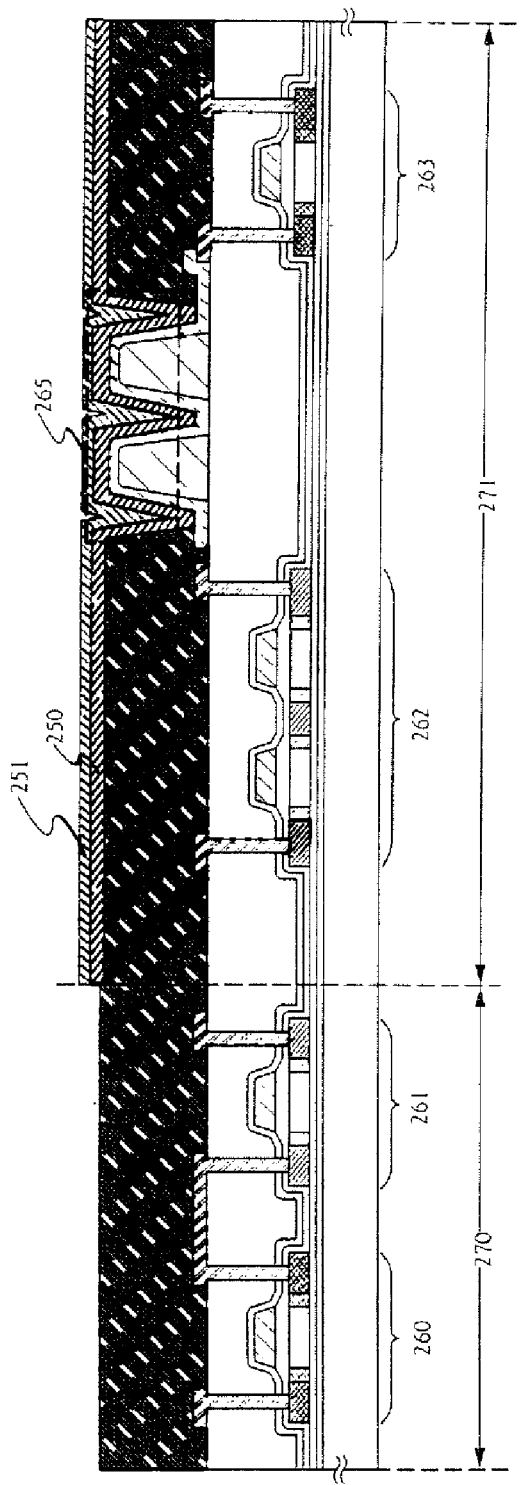

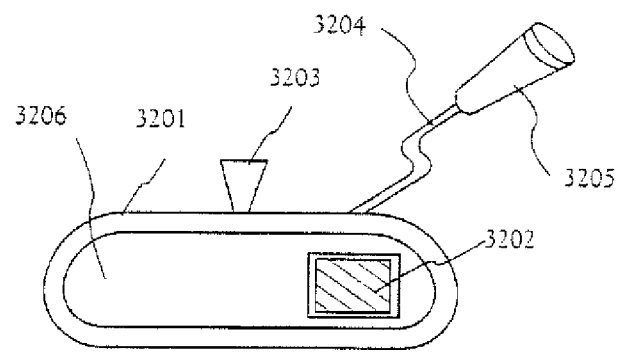
FIG. 15A
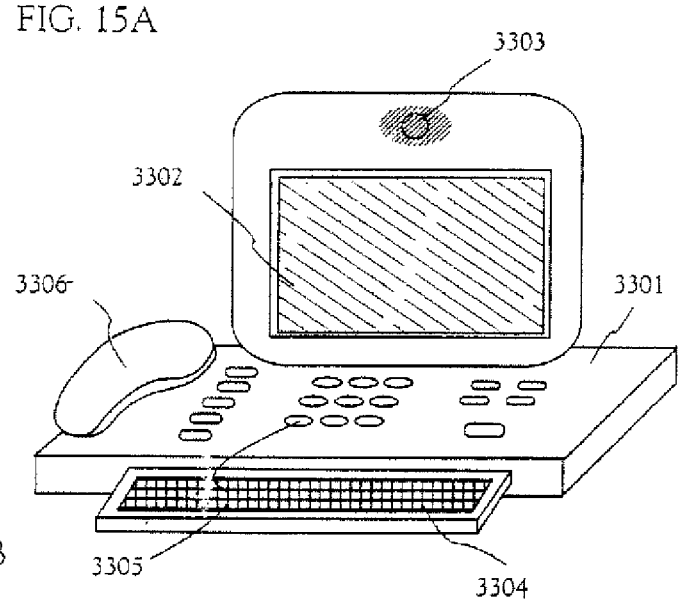
FIG. 15B
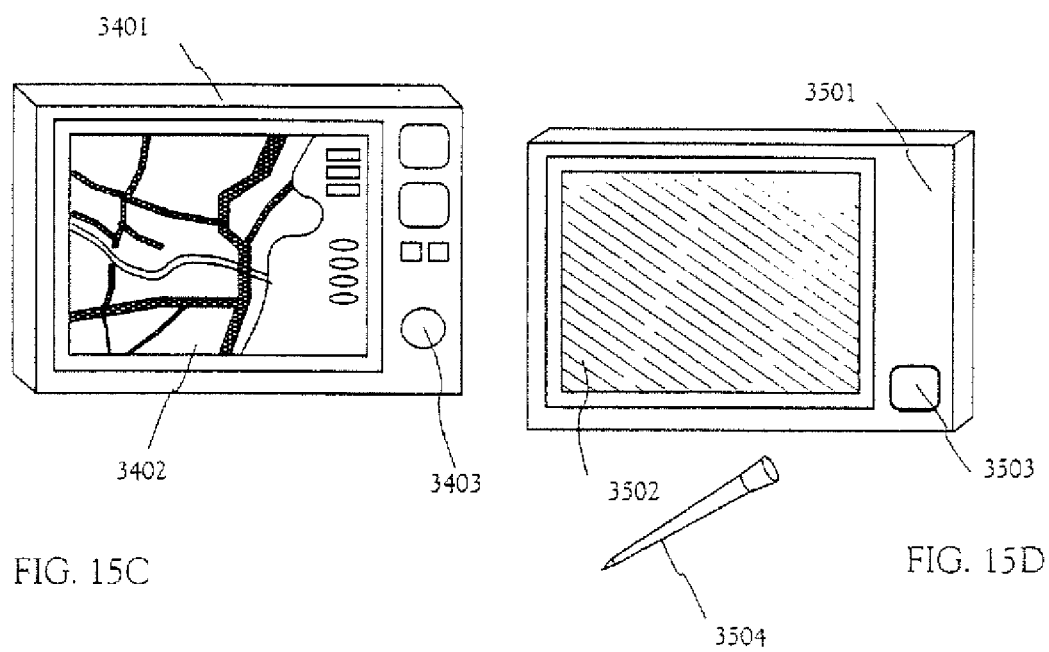
FIG. 15C
FIG. 15D

LIGHT EMITTING DEVICE COMPRISING TRANSPARENT PROTRUSION, FIRST AND SECOND ELECTRODES AND ORGANIC LAYER

BACKGROUND OF THE INVENTION

1. Field of the Invention

The present invention relates to a light emitting device using an element in which a light emitting material is sandwiched between electrodes (hereinafter referred to as a light emitting element) and a manufacturing method thereof.

2. Description of the Related Art

In recent years, development of a light emitting device using a light emitting element has been progressed. In the case of the light emitting device, since the light emitting element itself has light emitting ability, a back light such as that used in a liquid crystal display is unnecessary. Thus, thin size and light weight are possible.

There are two types of light emitting devices, that is, a passive type (simple matrix type) and an active type (active matrix), and both the types are actively developed. In particular, an active type light emitting device is noted at present. Also, as a material for a light emitting layer of an organic layer of the light emitting element, there are an organic material and an inorganic material. Further, the organic material is divided into a low molecular system (monomer system) organic material and a high molecular system (polymer system) organic material. Both the materials are actively studied, and film formation using the low molecular system organic material is performed by mainly a vacuum evaporation method and film formation using the high molecular system organic material is performed by mainly a spin coat method.

The organic material is characterized in that its light emitting efficiency is high and low voltage drive is possible, as compared with the inorganic material. Also, since the organic material is an organic compound, various new substances can be designed and produced. Thus, there is a possibility that an element which emits light at higher efficiency is found in accordance with progress of material design in the future.

FIG. 16 is a cross sectional view of a conventional light emitting device. The light emitting device has a construction which bonds a substrate 1601 on which a light emitting element is formed and a sealing substrate 1600 through a seal member 1605. Further, the light emitting element is composed of an anode 1602, an organic layer 1603, and a cathode 1604 and formed so as to sandwich the organic layer 1603 by the anode 1602 and the cathode 1604. Either the anode or the cathode is formed on the substrate. However, the anode is generally formed on the substrate because of the ease in manufacturing. According to the light emitting element, an electron injected from the cathode and a hole injected from the anode are recombined in the center of light emission of the organic film to produce an exciton and the exciton releases energy to emit light when it is returned to a ground state. The light emitting element is located in an enclosed space surrounded by the substrate 1601, the sealing substrate 1600, and the seal member 1605. In this specification, a region surrounded by the substrate, the sealing substrate, the seal member, and the light emitting element is called an enclosed space. Since the light emitting element deteriorates by moisture or oxygen, the enclosed space is filled with an inert gas (nitrogen molecule or noble gas) 1606. There may also be the case where the enclosed space is filled with an organic resin. Reference numeral 1608 denotes a switching TFT (thin film transistor), 1609 denotes a current control TFT, and 1610, 1611, and 1615 denote insulating films. A region of a pixel portion 1620 is shown by arrows in FIG. 16. In this specification, the term sealing substrate indicates a substrate bonded to the substrate through the seal member in order to protect the light emitting element which easily deteriorates by moisture.

Since a material having a high light reflecting property is used for the cathode of the light emitting device, light (incident light 1621) entered from the outside of the light emitting device is reflected from the cathode to produce reflecting light 1622. Thus, there is a case where the face of an observer 1616 is reflected in the cathode such as in a mirror and the observer 1616 recognizes copy-in. In this specification, the term copy-in indicates a state in which the face of an observer, a ceiling, or the like is reflected in a display unit (not shown) of the light emitting device by reflecting light from the cathode and the like. Thus, a circular deflection film 1612 and a polarization plate 1613 are used such that light which is incident from the outside of the light emitting device and reflected from the cathode is not emitted again to the outside. The circular deflection film and the polarization plate are located such that an angle formed by the polarization axes thereof becomes 45°. When such an installation is made, light which was incident from the outside and passed through the polarization plate becomes linearly polarized light. The linearly polarized light is twisted at 45° by the circular deflection film to become elliptically polarized light. The elliptically polarized light is reflected from the cathode and becomes linearly polarized light by the circular deflection film. Since an angle formed by this linearly polarized light and the polarization axis of the polarization plate becomes 90°, reflecting light is absorbed in the polarization plate. Thus, the circular deflection film 1612 and the polarization plate 1613 are provided in the light emitting device such that the copy-in is invisible to an observer 1616.

Therefore, when the circular deflection film 1612 and the polarization plate 1613 are used in the light emitting device as shown in FIG. 16, light is absorbed in the polarization plate 1613 at about half the amount (38% to 48%) thereof. Further, light emitted from the organic layer 1603 is also absorbed in the polarization plate at about half the amount thereof. Thus, there is a problem in that the brightness recognized by the observer 1616 is decreased at about half.

SUMMARY OF THE INVENTION

The surface of the cathode of the light emitting device is made to be uneven. When the surface of the cathode is made to be uneven, since incident light is reflected in all directions, the copy-in becomes invisible to the observer.

Therefore, according to a construction of the present invention disclosed in this specification, a light emitting device comprising:

a transparent protrusion;

a pixel electrode formed on the transparent protrusion and along the transparent protrusion;

an organic layer formed over the pixel electrode and in contact with a portion of the pixel electrode; and a cathode provided on the organic layer and along the organic layer, characterized in that the surface of the cathode which is in contact with the organic layer is uneven by the formation of the transparent protrusion.

First, transparent protrusions 164 each having a height of about 0.5 μm to 1.0 μm are formed (see FIG. 3B). Next, a pixel electrode having a thickness of 80 nm to 120 nm and an organic layer having a thickness of 10 nm to 400 nm are formed along the transparent protrusions. In such a case, since the thicknesses of the pixel electrode and the organic layer are extremely small as compared with the height of the transparent protrusions 164, the surface of the organic layer becomes uneven. Thus, when the cathode is formed on the organic layer, the surface of the cathode which is in contact with the organic layer becomes uneven. Since the surface of the cathode which is in contact with the organic layer of the light emitting device of the present invention becomes uneven, when the light emitting device of the present invention is used, incident light is reflected in all directions. Therefore, the copy-in becomes invisible to the observer.

Also, according to another construction of the present invention, a light emitting device is characterized in that an insulating film having a high light absorption property is formed in the transverse direction of the transparent protrusions. Thus, according to the construction of the present invention, since the insulating film having a high light absorption property is formed in the transverse direction of the transparent protrusions, the reflecting light from the cathode, a source wiring, a drain wiring, and the like is suppressed and the reflection of light can be prevented. Note that, in the case where the insulating film having a high light absorption property is applied, there is an effect in that the reflecting light is suppressed and the reflection of light is prevented, as compared with the case where the surface of the cathode is made to be uneven.

Also, according to another construction of the present invention, a microlens may be used as the transparent protrusions.

The light emitting device of the present invention can be used for a personal computer, a video camera, a portable information terminal, a digital camera, a digital video disk player, a monitor for viewing the rear of a car for an automobile, a television telephone, a car navigation system, and an electronic game device.

BRIEF DESCRIPTION OF THE DRAWINGS

FIGS. 7A and 7B show manufacturing steps of the tight emitting device of Embodiment 2;

FIGS. 15A to 15D show electrical devices of Embodiment 4; and

DETAILED DESCRIPTION OF THE PREFERRED EMBODIMENTS

Embodiment Mode

Figure 5:
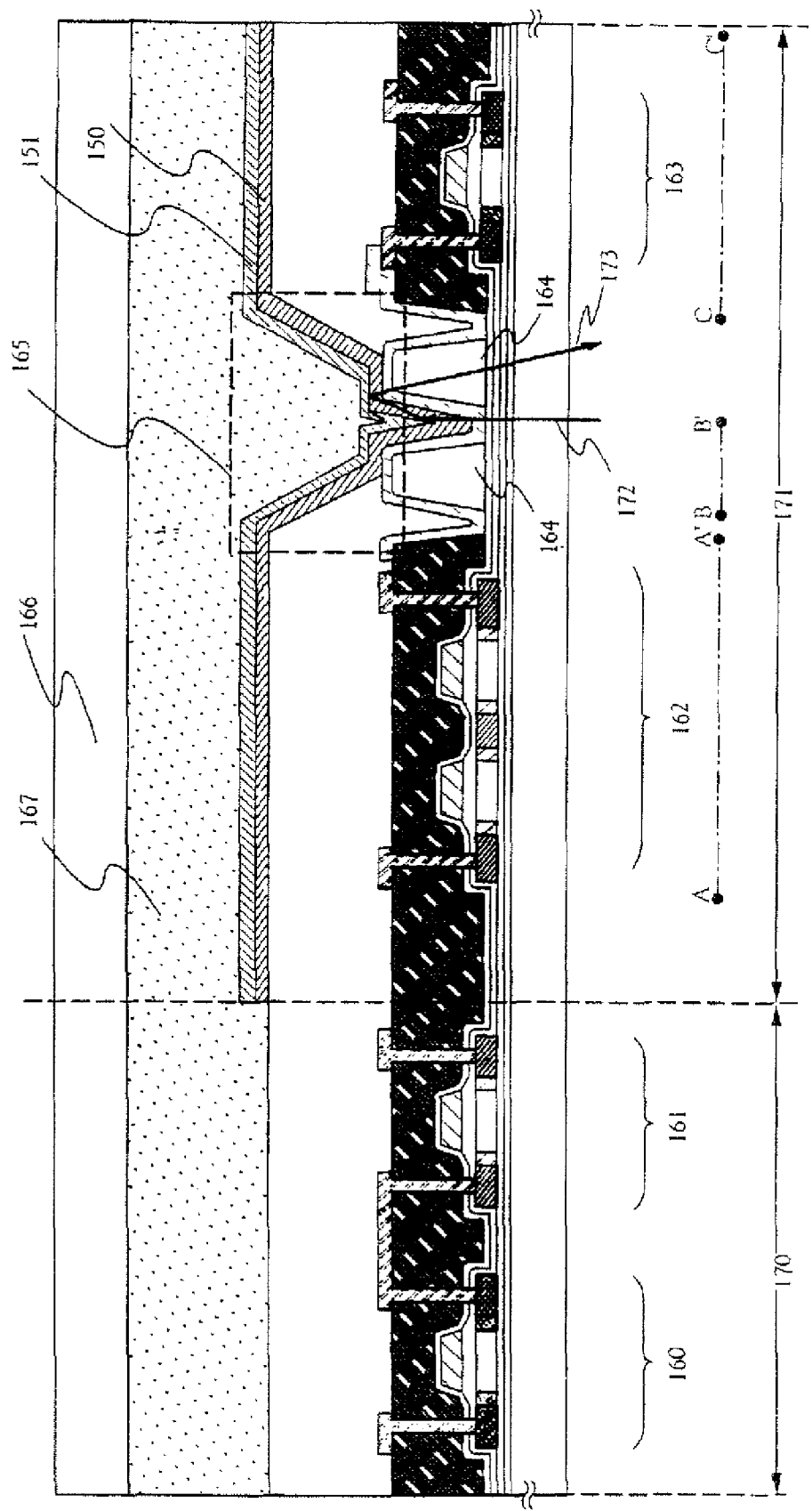
FIG. 5 is a cross sectional view of the light emitting device of Embodiment 1.
Figure 12A:
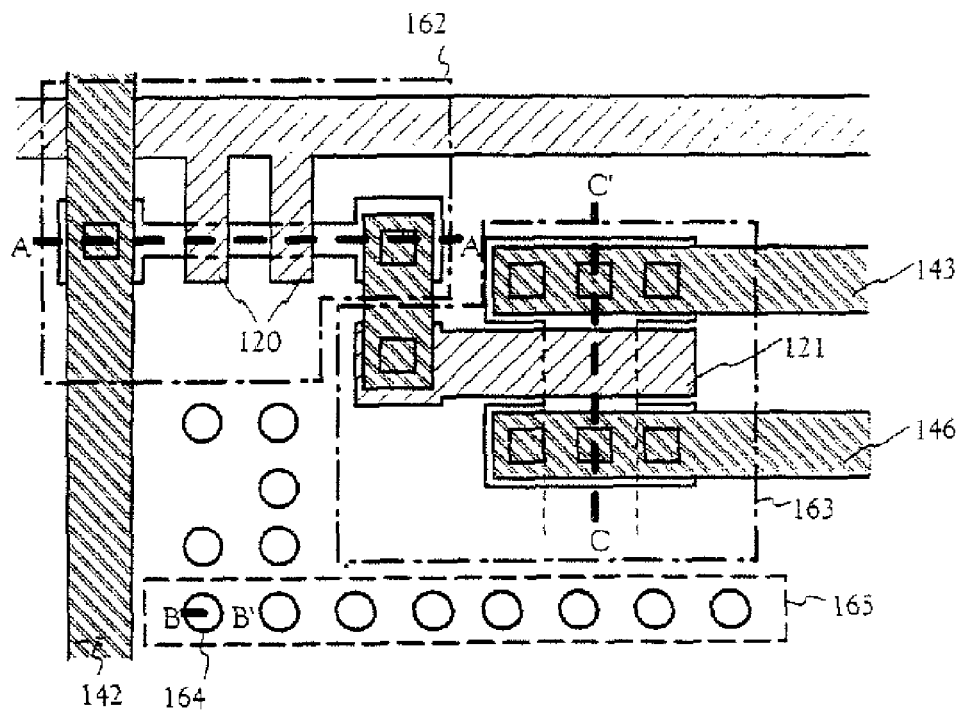
FIG. 12A is a top view of the light emitting device and FIG. 12B shows top surface shapes of a transparent protrusion of Embodiment 1.

An embodiment mode of the present invention will be described below. FIG. 12A is a top view (pixel portion) of FIG. 5 in this embodiment mode. Note that a substrate, a base film, an insulating film, a pixel electrode, an organic layer, a cathode, a sealing substrate, and the like are omitted here for the sake of simplification. FIG. 5 is a cross sectional view of a light emitting device of this embodiment mode in dotted line portions A-A', B-B', and C-C' of FIG. 12A. Here, a method of simultaneously manufacturing a switching TFT 162 and a current control TFT 163 in the pixel portion 171 and TFTs (p-channel TFT 160 and n-channel TFT 161) in a driver circuit 170 provided in the periphery of the pixel portion will be described.

Figure 1A:
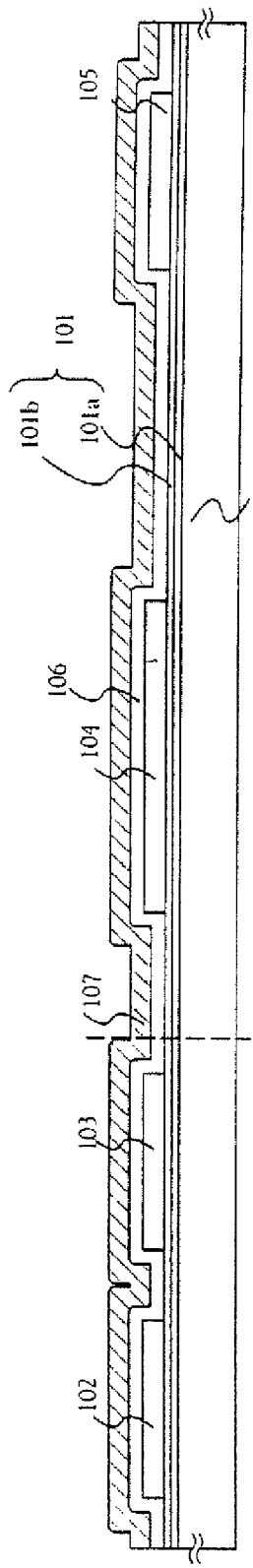
FIGS. 1A to 1D show manufacturing steps of a light emitting device of Embodiment 1.

First, as shown in FIG. 1A, a base film 101 made from an insulating film such as a silicon oxide film, a silicon nitride film, or a silicon oxynitride film is formed on a substrate 100. A material of the substrate 100 is preferably an insulating substance such as amorphous glass (borosilicate glass, quartz, or the like), crystallized glass, ceramics glass, glass, or polymer. Also, it may be an insulating substance such as an organic system resin (acrylic system resin, styrene system resin, polycarbonate system resin, or epoxy system resin) or a silicone system resin polymer.

Next, semiconductor layers 102 to 105 are formed on the base film 101. A semiconductor film having an amorphous structure is formed by known means (sputtering method, LPCVD method, plasma CVD method, or the like) and then a crystalline semiconductor film obtained by known crystallization processing (laser crystallization method, thermal crystallization method, thermal crystallization method using a catalyst such as nickel, or the like) is patterned in a predetermined shape to form the semiconductor layers 102 to 105. The semiconductor layers 102 to 105 are formed so as to have a thickness of 25 nm to 80 nm (preferably, 30 nm to 60 nm).

Next, a gate insulating film 106 covering the semiconductor layers 102 to 105 is formed by a plasma CVD method or a sputtering method.

Then, a heat-resistant conductive layer 107 for forming the gate electrode is formed on the gate insulating film 106 at a thickness of 200 mm to 400 nm (preferably, 250 nm to 350 nm).

Next, a mask 108 made of a resist is formed using a photolithography technique. Then, first etching processing is performed.

Figure 1B:
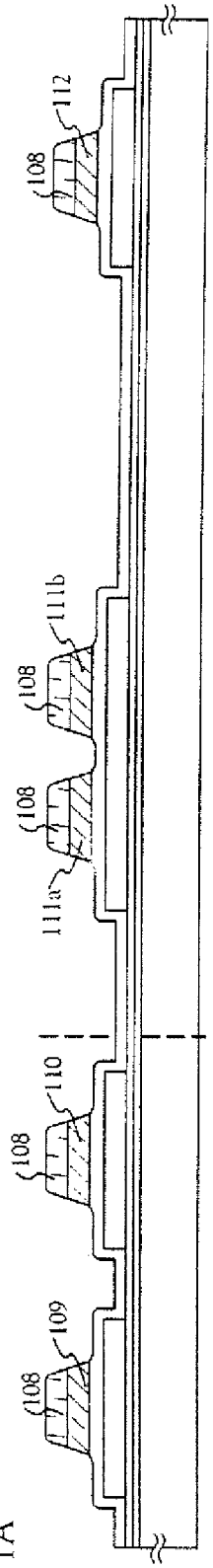

Conductive layers 109 to 112 having first taper shapes are formed by the first etching processing (FIG. 1B).

Figure 1C:
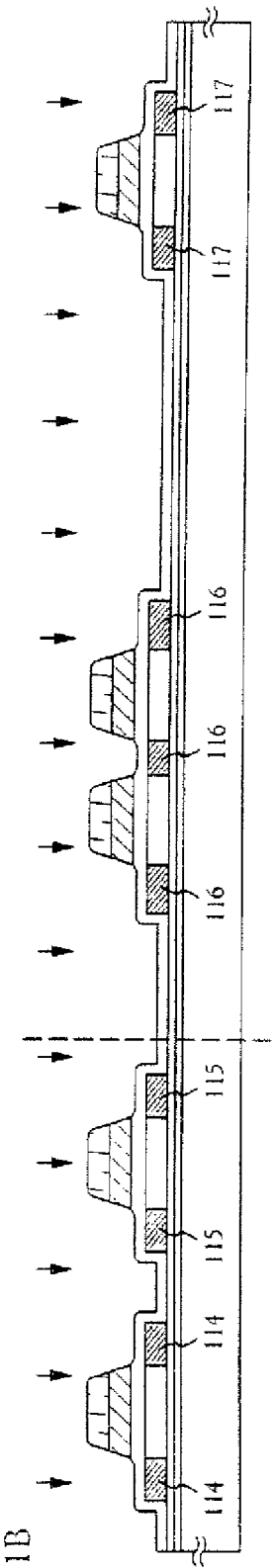

Then, first doping processing is performed to add an impurity element of one conductivity type to the semiconductor layers (FIG. 1C).

Figure 1D:
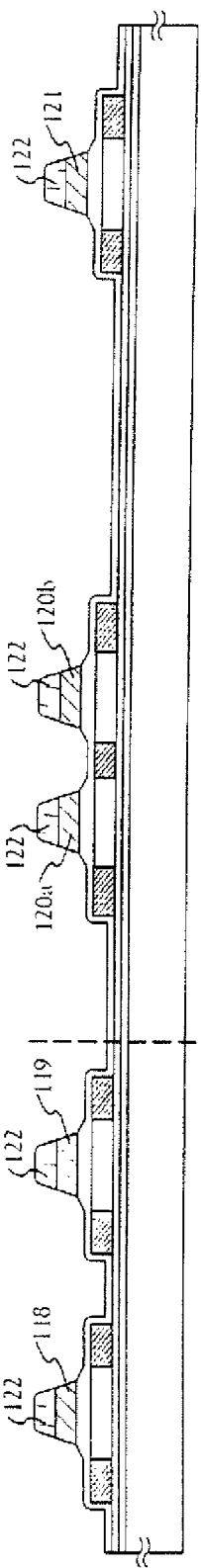

Next, second etching processing is performed as shown in FIG. 1D.

Figure 2A:
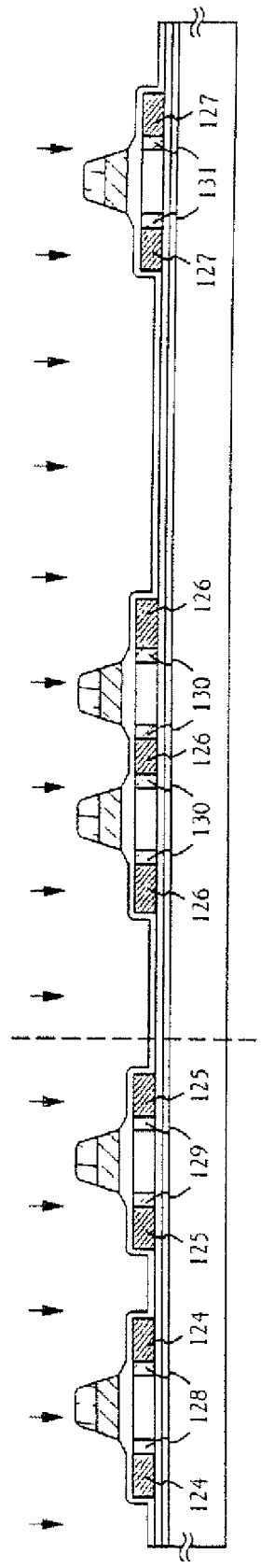
FIGS. 2A to 2C show manufacturing steps of the light emitting device of Embodiment 1.

Then, a dose is reduced as compared with the first doping processing and an impurity element for providing an n-type is doped under a condition of a high accelerating voltage (FIG. 2A, second doping).

Figure 2B:
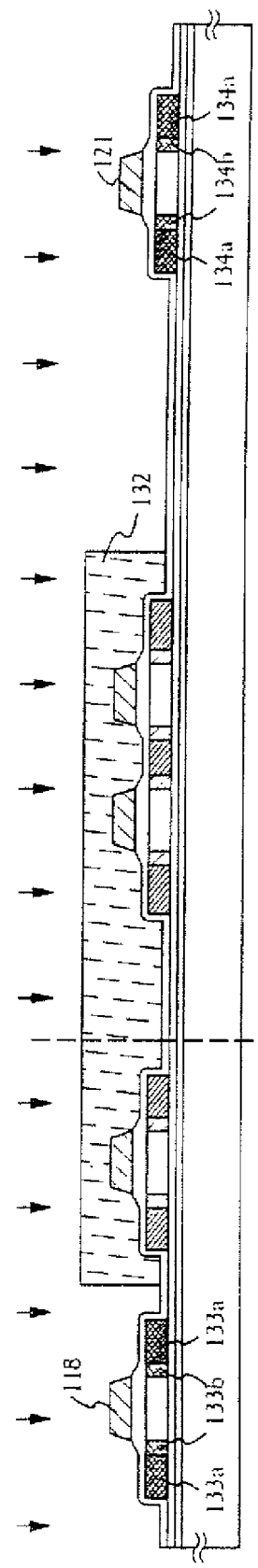

Then, as shown in FIG. 2B, impurity regions 133 (133*a* and 133*b*) and 134 (134*a* and 134*b*) of a conductivity type which is reverse to the one conductivity type are formed in the semiconductor layer 102 and the semiconductor layer 105 composing the p-channel TFTs. Even in this case, an impurity element for providing a p-type is added using conductive layers 118 and 121 having second shapes as masks to form impurity regions in a self alignment manner (FIG. 2B, third doping).

Figure 2C:
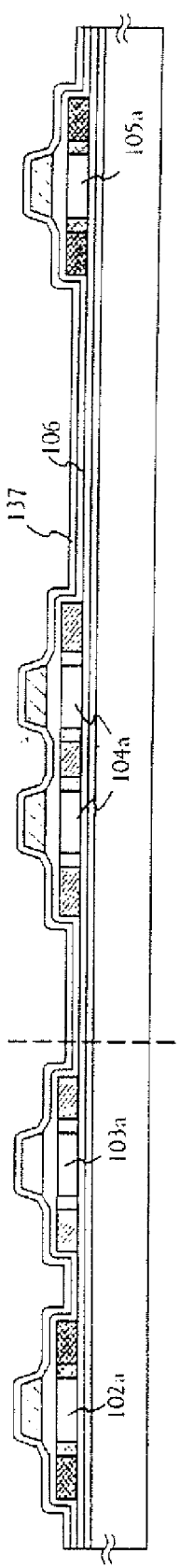

After that, as shown in FIG. 2C, a first interlayer insulating film 137 is formed on the conductive layers 118 to 121 having second shapes and the gate insulating film 106. Then, a step of activating the impurity elements for providing an n-type or a p-type, which are added at their respective concentrations, is performed. This step is performed by a thermal anneal method using a furnace anneal (FIG. 2C, formation step of the first interlayer insulating film and activation step).

Next, an atmosphere gas is changed and thermal treatment is performed in an atmosphere including 3% to 100% hydrogen at 300° C. to 450° C. for 1 hour to 12 hours to perform a step of hydrogenating the semiconductor layers.

Then, a second interlayer insulating film made of an organic insulator material is formed with an average film thickness of 1.0 μm to 2.0 μm by a spin coat method. In this embodiment, a carbon black as a negative type photosensitive resin is used. However, any insulating film having a high light absorption property may be used.

After that, a resist mask having a predetermined pattern is formed and then contact holes which reach the impurity regions that are formed in the respective semiconductor layers and are the source region or the drain region and an opening are formed. The contact holes and the opening are formed by a dry etching method. Thus, second interlayer insulating films 139a and 139b are formed.

Then, a conductive metallic film is formed by a sputtering method or a vacuum evaporation method, patterned using a photo mask, and then etched to form source wirings 140 to 143 and drain wirings 144 to 146.

Next, transparent protrusions 164 are formed on the first interlayer insulating film 137 and between the second interlayer insulating films 139a and 139b (in the opening) by exposure and development using a photo mask. Here, a photosensitive acrylic material is used as a material for forming the transparent protrusions. However, any transparent material may be used. Also, a shape of the protrusion and the number thereof are not limited. The height of the transparent protrusions 164 is about 0.5 μm to 1.0 μm after baking.

Note that the transparent protrusions 164 may be formed before the formation of the source wirings 140 to 143 and the drain wirings 144 to 146.

Figure 4A:
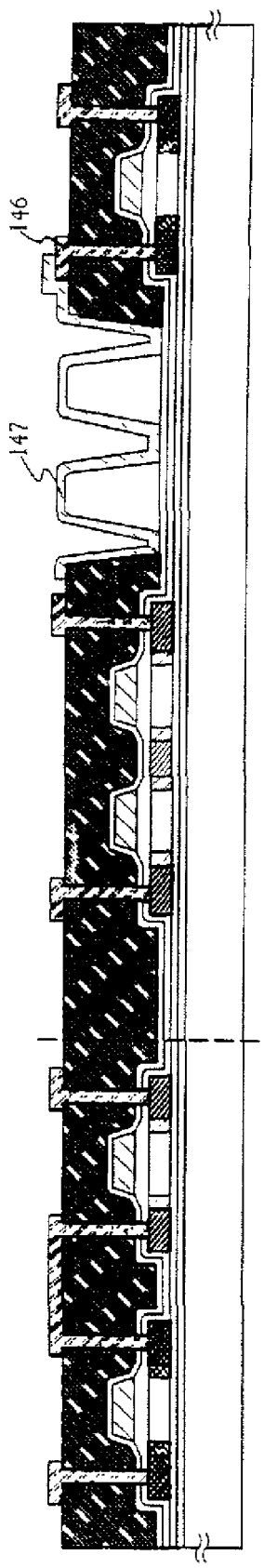
FIGS. 4A and 4B show manufacturing steps of the light emitting device of Embodiment 1.

Then, a transparent conductive film is formed on the transparent protrusions at a thickness of 80 nm to 120 nm and patterned to form a pixel electrode 147 (FIG. 4A, formation of the pixel electrode). The pixel electrode 147 corresponds to the anode. A conductive film having a large work function, platinum, gold, nickel, palladium, iridium, or cobalt is used as other material of the anode. The anode is formed by a sputtering method, a vacuum evaporation method, or the like and patterned by a photolithography.

When the pixel electrode 147 is formed in contact with the drain wiring 146 and overlapped therewith, it is electrically connected with the drain region of the current control TFT 163.

Figure 4B:
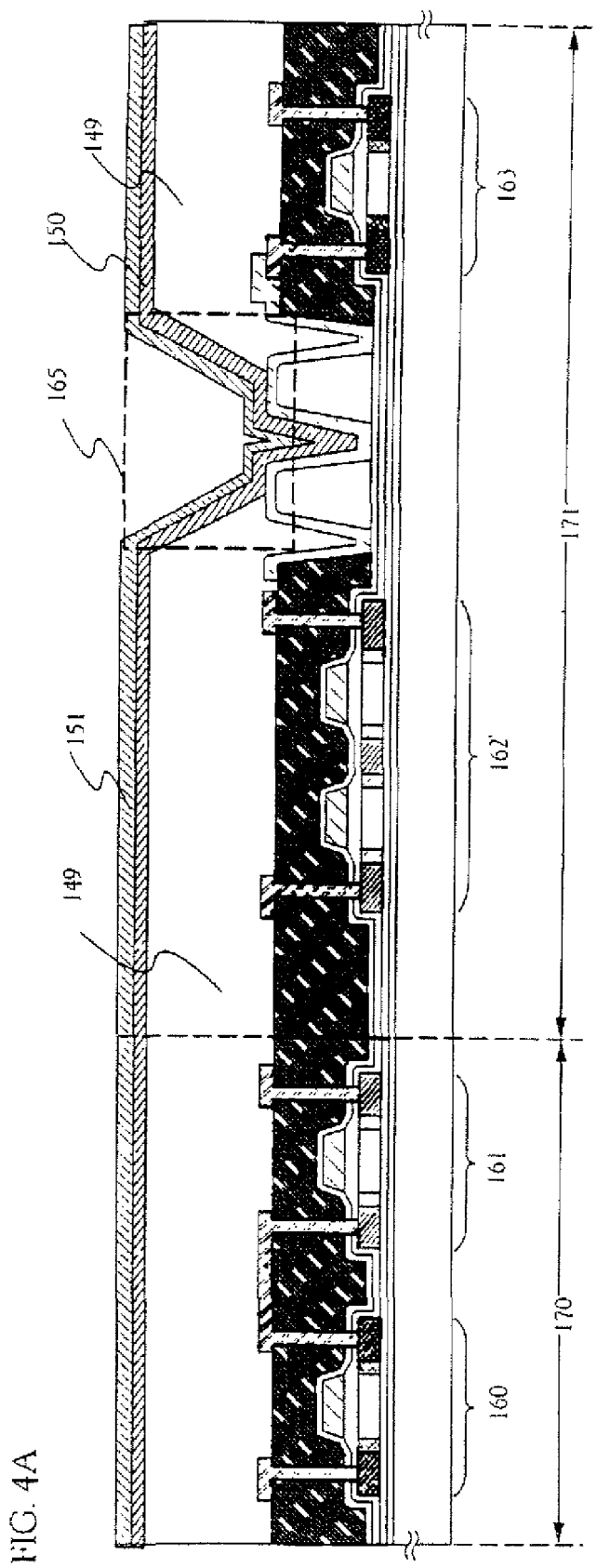

Next, as shown in FIG. 4B, a third interlayer insulating film 149 is formed first.

Next, an organic layer 150 is formed in an inert gas (nitrogen or noble gas) atmosphere by a vacuum evaporation method using a metallic mask and further a cathode (MgAg electrode) 151 is formed by an evaporation method. The succeeding processes are performed in an inert gas (nitrogen or noble gas) atmosphere.

The MgAg electrode is used as a material of the cathode 151. Also, metal having a small work function, typically, an element belonging to the group 1 or the group 2 of the periodic table (magnesium, lithium, potassium, barium, calcium, sodium, or beryllium) or metal having a work function close to the element above may be used. Further, aluminum is used as a material of the cathode and lithium fluoride or lithium acetylacetonate complex may be formed as a buffer layer of the cathode under aluminum. When a material having a high light reflecting property is used, an effect due to the structure of the light emitting device of this embodiment mode is exhibited.

Note that a known material can be used for the organic layer 150. When the organic layer 150 having a laminate structure is used, light emitting efficiency is high. Thus, the organic layer having a laminate structure is used in many cases. However, the organic layer may be used as a single layer. Generally, a hole injecting layer, a hole transporting layer, a light emitting layer, and an electron transporting layer are formed in this order on the anode. However, a structure such as a hole transporting layer, a light emitting layer, and an electron transporting layer are formed or a structure such as a hole injecting layer, a hole transporting layer, a light emitting layer, an electron transporting layer, and an electron injecting layer are formed may also be used. In the present invention, either structure may be used. Also, a material capable of converting energy generated when returning from a triplet excitation state to a ground state into light to be emitted may be used for the light emitting layer.

Note that a film thickness of the organic layer 150 is desirably set to be 10 nm to 400 nm (typically, 60 nm to 150 nm) and a thickness of the cathode 151 is desirably set to be 80 nm to 200 nm (typically, 100 nm to 150 nm).

Thus, a plurality of transparent protrusions 164 are provided, the pixel electrode 147 is formed so as to overlap the transparent protrusions, the organic layer 150 is formed so as to overlap the pixel electrode 147, and the cathode 151 is formed on the organic layer 150. Therefore, a large number of uneven portions 165 are formed on the surface of the cathode which is in contact with the organic layer 150.

Further, in order to reduce resistance, a protective electrode may be formed on the cathode 151. A material of the protective electrode is typically a metallic film containing mainly aluminum. Of course, other materials may also be used. Further, a protective film may be provided in order to protect the organic layer 150 and the cathode 151 from moisture and oxygen. After the formation of the protective electrode, the protective film may be successively formed without exposing it to air.

Next, a sealing substrate 166 is bonded to the resultant substrate 100 through a seal member (not shown) and cut into a predetermined size. Thus, the light emitting device shown in FIG. 5 is completed through the above steps. Note that a region in which the pixel electrode 147, the organic layer 150, and the cathode 151 are overlapped with one another corresponds to the light emitting element.

A material of the substrate 166 is preferably an insulating material such as amorphous glass (borosilicate glass, quartz, or the like), crystallized glass, ceramics glass, glass, or polymer. Also, it may be an insulating substance such as an organic system resin (acrylic system resin, styrene system resin, polycarbonate system resin, or epoxy system resin) or a silicone system resin polymer. Ceramics may also be used.

When the seal member is made of an insulator, a metallic material such as a stainless alloy can be also used. An epoxy system resin, an acrylate system resin, or the like can be used as a material of the seal member. A heat curable resin or a light curable resin can be also used for the seal member. Note that the seal member is desirably a material for minimizing transmission of moisture. A region surrounded by the substrate 100, the sealing substrate 166, the seal member, the cathode 151, and the interlayer insulating film 149 is filled with an inert gas 167.

As described above, the transparent protrusions 164 are provided in the light emitting device of this embodiment mode and a large number of uneven portions 165 are formed on the surface of the cathode 151 which is in contact with the organic layer 150. Thus, incident tight from the outside is diffused and reflected and the direction of the reflecting light becomes random.

Also, since the insulating film having high light absorption property is provided in the transverse direction of the transparent protrusions 164, the reflecting light from the cathode, the source wiring, the drain wiring, and the like is suppressed and the reflection of light can be prevented. Thus, the copy-in is invisible to the observer. Note that, in the case where the insulating film having a high light absorption property is applied, there is an effect in that the reflecting light is suppressed and the reflection of light is prevented, as compared with the case where the surface of the cathode is made to be uneven.

Further, since the circular deflection film and the polarization plate are not used in the light emitting device of this embodiment mode, the brightness recognized by the observer becomes about two times larger than that in a conventional light emitting device.

Figure 12B:
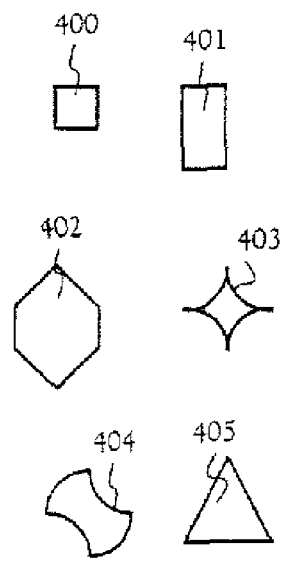

Note that, if a short circuit is made between the cathode and the anode (pixel electrode), the transparent protrusions may be formed in any shape. Considering easiness in diffusing and reflecting light, it is desirable that unevenness is maximized. FIG. 12A is a top view of the transparent protrusions with circular shapes. However, the shape is not particularly limited thereto and a cross section in a diameter direction may be a polygon or may be an nonsymmetric shape. For example, of shapes 400-405 shown in FIG. 12B, any shape may be used. Also, the transparent protrusions may be located regularly or irregularly.

Figure 8:
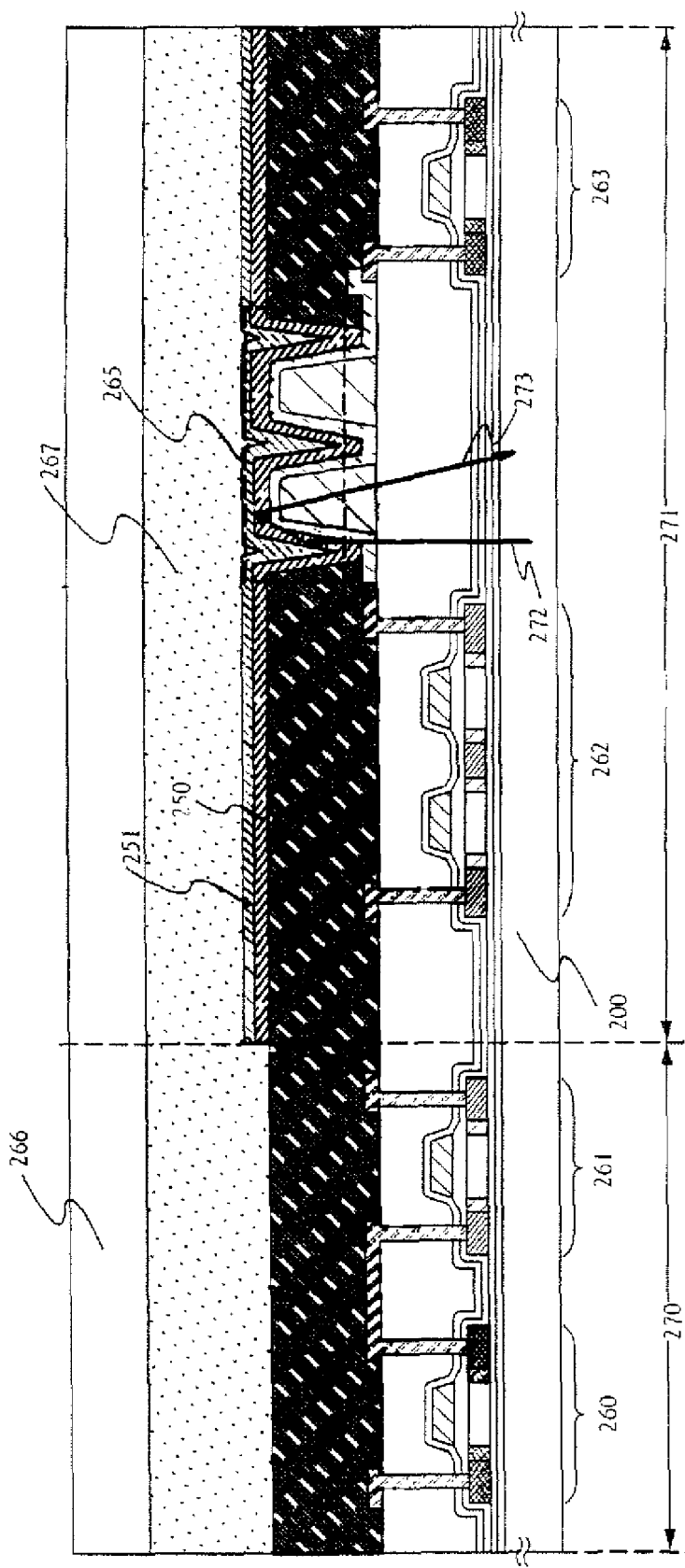
FIG. 8 is a cross sectional view of the light emitting device of Embodiment 2.

Also, as shown in FIG. 8, a material having a high light absorption property is applied to the third interlayer insulating film located on the source wiring and the drain wiring, the transparent protrusions may be formed in the transverse direction of the opening of the third interlayer insulating film and the uneven portion may be formed on the surface of the cathode.

Figure 11:
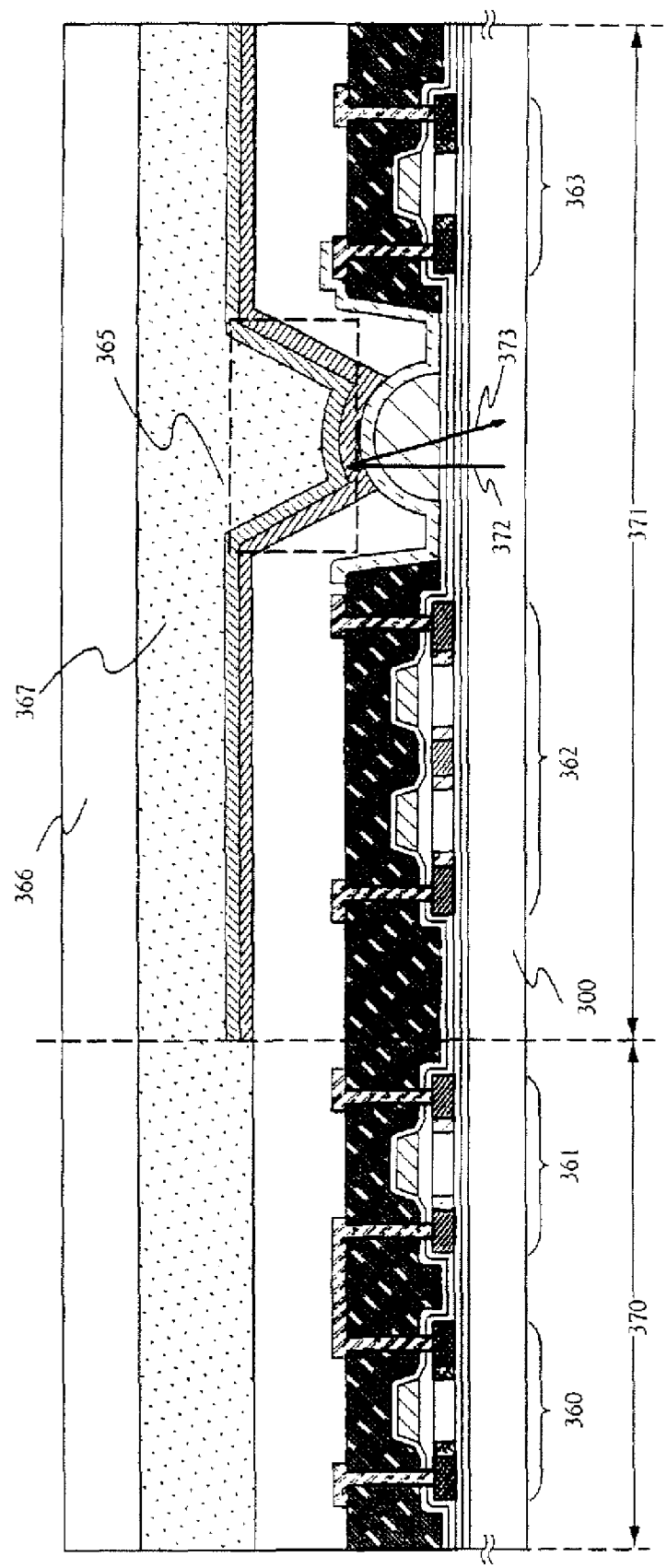
FIG. 11 is a cross sectional view of the light emitting device of Embodiment 3.

Further, as shown in FIG. 11, the transparent protrusions may be a microlens. A known method may be used as a method of manufacturing the microlens.

The present invention can be applied not only to an active type light emitting device but also to a passive type light emitting device.

The present invention made by the above structure will be described in more detail using the following embodiments.

Embodiment 1

Embodiments of the present invention is explained as follows. The top view of FIG. 5 (the pixel portion 171) is shown in FIG. 12A. However, a substrate, a base film, an insulating film, a pixel electrode, an organic layer, a cathode and sealing substrate are omitted for the simplification. The cross sectional view taken along the dot lines A-A', B-B' and C-C' of the light emitting device in FIG. 12A are shown in FIG. 5. Herein, a method for simultaneously manufacturing of the switching TFT 162 of the pixel portion 171, the current control TFT 163 and the TFTs (p-channel TFT 160 and n-channel TFT 161) in the driver circuit 170 which is provided in periphery portion of the pixel portion 171 is described.

One of the examples of manufacturing method of the light-emitting device is described with FIGS. 1A to 5.

This embodiment uses a substrate 100 of a glass such as barium borosilicate glass or aluminoborosilicate glass as represented by the glass #7059 or the glass #1737 of Corning Co. There is no limitation on the substrate 100 provided it has a property of transmitting light, and there may be used a quartz substrate. There may be further used a plastic substrate having heat resistance capable of withstanding the treatment temperature of this embodiment.

Referring next to FIG. 1A, an underlying film 101 comprising an insulating film such as silicon oxide film, silicon nitride film or silicon oxynitride film is formed on the substrate 100. In this embodiment, the underlying film 101 has a two-layered structure. There, however, may be employed a structure in which a single layer or two or more layers are laminated on the insulating film. The first layer of the underlying film 101 is a silicon oxynitride film 101a formed maintaining a thickness of from 10 to 200 nm (preferably, from 50 to 100 nm) relying upon a plasma CVD method by using $SiH_4$, $NH_3$ and $N_2O$ as reaction gases. In this embodiment, the silicon oxynitride film 101a (having a composition ratio of Si=32%, O=27%, N=24%, H=17%) is formed maintaining a thickness of 50 nm. The second layer of the underlying film 101 is a silicon oxynitride film 101b formed maintaining a thickness of from 50 to 200 nm (preferably, from 100 to 150 nm) relying upon the plasma CVD method by using $SiH_4$ and $N_2O$ as reaction gases. In this embodiment, the silicon oxynitride film 101b (having a composition ratio of Si=32%, O=59%, N=7%, H=2%) is formed maintaining a thickness of 100 nm.

Then, semiconductor layers 102 to 105 are formed on the underlying film 101. The semiconductor layers 102 to 105 are formed by forming a semiconductor film having an amorphous structure by a known means (sputtering method, LPCVD method or plasma CVD method) followed by a known crystallization processing (laser crystallization method, heat crystallization method or heat crystallization method using a catalyst such as nickel), and patterning the crystalline semiconductor film thus obtained into a desired shape. The semiconductor layers 102 to 105 are formed in a thickness of from 25 to 80 nm (preferably, from 30 to 60 nm). Though there is no limitation on the material of the crystalline semiconductor film, there is preferably used silicon or a silicon-germanium ($Si_xGe_{1-x}$(X=0.0001 to 0.02)) alloy. In this embodiment, the amorphous silicon film is formed maintaining a thickness of 55 nm relying on the plasma CVD method and, then, a solution containing nickel is held on the amorphous silicon film. The amorphous silicon film is dehydrogenated (500° C., one hour), heat crystallized (550° C., 4 hours) and is, further, subjected to the laser annealing to improve the crystallization, thereby to form a crystalline silicon film. The crystalline silicon film is patterned by the photolithographic method to form island-like semiconductor layers 102 to 105.

The semiconductor layers 102 to 105 that have been formed may further be doped with trace amounts of an impurity element (boron or phosphorus) to control the threshold value of the TFT.

In forming the crystalline semiconductor film by the laser crystallization method, further, there may be employed an excimer laser of the pulse oscillation type or of the continuously light emitting (continuous wave) type, a YAG laser or a $YVO_4$ laser. When these lasers are to be used, it is desired that a laser beam emitted from a laser oscillator is focused into a line through an optical system so as to fall on the semiconductor film. The conditions for crystallization are suitably selected by a person who carries out the process. When the excimer laser is used, the pulse oscillation frequency is set to be 300 Hz and the laser energy density to be from 100 to 400 $mJ/cm^2$ (typically, from 200 to 300 $mJ/cm^2$). When the YAG laser is used, the pulse oscillation frequency is set to be from 30 to 300 kHz by utilizing the second harmonics and the laser energy density to be from 300 to 600 $mJ/cm^2$ (typically, from 350 to 500 $mJ/cm^2$). The whole surface of the substrate is irradiated with the laser beam focused into a line of a width of 100 to 1000 μm, for example, 400 μm, and the overlapping ratio of the linear beam at this moment is set to be 50 to 90%.

Then, a gate insulating film 106 is formed to cover the semiconductor layers 102 to 105. The gate insulating film 106 is formed of an insulating film containing silicon maintaining a thickness of from 40 to 150 nm by the plasma CVD method or the sputtering method. In this embodiment, the gate insulating film is formed of a silicon oxynitride film (composition ratio of Si=32%, O=59%, N=7%, H=2%) maintaining a thickness of 110 nm by the plasma CVD method. The gate insulating film is not limited to the silicon oxynitride film but may have a structure on which is laminated a single layer or plural layers of an insulating film containing silicon.

When the silicon oxide film is to be formed, TEOS (tetraethyl orthosilicate) and $O_2$ are mixed together by the plasma CVD method, and are reacted together under a reaction pressure of 40 Pa, at a substrate temperature of from 300 to 400° C., at a high frequency of 13.56 MHz and a discharge electric power density of from 0.5 to 0.8 $W/cm^2$. The thus formed silicon oxide film is, then, heat annealed at 400 to 500° C. thereby to obtain the gate insulating film having good properties.

Then, a heat resistant conductive layer 107 is formed on the gate insulating film 106 maintaining a thickness of from 200 to 400 nm (preferably, from 250 to 350 nm) to form the gate electrode. The heat resistant conductive layer 107 may be formed as a single layer or may, as required, be formed in a structure of laminated layers of plural layers such as two layers or three layers. The heat resistant conductive layer contains an element selected from Ta, Ti and W, or contains an alloy of the above element, or an alloy of a combination of the above elements. The heat resistant conductive layer is formed by the sputtering method or the CVD method, and should contain impurities at a decreased concentration to decrease the resistance and should, particularly, contain oxygen at a concentration of not higher than 30 ppm.

On the other hand, the Ta film that is used as the heat resistant conductive layer 107 can similarly be formed by the sputtering method. The Ta film is formed by using Ar as a sputtering gas. Further, the addition of suitable amounts of Xe and Kr into the gas during the sputtering makes it possible to relax the internal stress of the film that is formed and to prevent the film from being peeled off. The Ta film of α-phase has a resistivity of about 20 μΩcm and can be used as the gate electrode but the Ta film of β-phase has a resistivity of about 180 μΩcm and is not suited for use as the gate electrode. The TaN film has a crystalline structure close to the α-phase. Therefore, if the TaN film is formed under the Ta film, there is easily formed the Ta film of α-phase. Further, though not diagramed, formation of the silicon film doped with phosphorus (P) maintaining a thickness of about 2 to about 20 nm under the heat resistant conductive layer 107 is effective in fabricating the device. This helps improve the intimate adhesion of the conductive film formed thereon, prevent the oxidation, and prevent trace amounts of alkali metal elements contained in the heat resistant conductive layer 107 from being diffused into the gate insulating film 106 of the first shape. In any way, it is desired that the heat resistant conductive layer 107 has a resistivity over a range of from 10 to 50 μΩcm.

Next, a mask 108 is formed by a resist relying upon the photolithographic technology. Then, a first etching is executed. This embodiment uses an ICP etching apparatus, uses $Cl_2$ and $CF_4$ as etching gases, and forms a plasma with RF (13.56 MHz) electric power of 3.2 $W/cm^2$ under a pressure of 1 Pa. The RF (13.56 MHz) electric power of 224 $mW/cm^2$ is supplied to the side of the substrate (sample stage), too, whereby a substantially negative self bias voltage is applied. Under this condition, the W film is etched at a rate of about 100 nm/min. The first etching treatment is effected by estimating the time by which the W film is just etched relying upon this etching rate, and is conducted for a period of time which is 20% longer than the estimated etching time.

The conductive layers 109 to 112 having a first tapered shape are formed by the first etching treatment. The conductive layers 109 to 112 are tapered at an angle of from 15 to 30°. To execute the etching without leaving residue, over etching is conducted by increasing the etching time by about 10 to 20%. The selection ratio of the silicon oxynitride film (gate insulating film 106) to the W film is 2 to 4 (typically, 3). Due to the over etching, therefore, the surface where the silicon oxynitride film is exposed is etched by about 20 to about 50 nm (FIG. 1B, the first etching).

Then, a first doping treatment is effected to add an impurity element of a first type of electric conduction to the semiconductor layer. Here, a step is conducted to add an impurity element for imparting the n-type. A mask 108 forming the conductive layer of a first shape is left, and an impurity element is added by the ion doping method to impart the n-type in a self-aligned manner with the conductive layers 109 to 112 having a first tapered shape as masks. The dosage is set to be from $1\times10^{13}$ to $5\times10^{14}$ atoms/$cm^2$ so that the impurity element for imparting the n-type reaches the underlying semiconductor layer penetrating through the tapered portion and the gate insulating film 106 at the ends of the gate electrode, and the acceleration voltage is selected to be from 80 to 160 keV. As the impurity element for imparting the n-type, there is used an element belonging to the Group 15 in the periodic table and, typically, phosphorus (P) or arsenic (As). Phosphorus (P) is used, here. Due to the ion doping method, an impurity element for imparting the n-type is added to the first impurity regions 114 to 117 over a concentration range of from $1\times10^{20}$ to $1\times10^{21}$ atoms/$cm^3$ (FIG. 1C, the first doping processing).

In this step, the impurities turn down to the lower side of the conductive layers 109 to 112 of the first shape depending upon the doping conditions, and it often happens that the first impurity regions 114 to 117 are overlapped with the conductive layers 109 to 112 of the first shape.

Next, the second etching treatment is conducted as shown in FIG. 1D. The etching treatment, too, is conducted by using the ICP etching apparatus, using a mixed gas of $CF_4$ and $Cl_2$ as an etching gas, using an RF electric power of 3.2 $W/cm^2$ (13.56 MHz), a bias power of 45 $mW/cm^2$ (13.56 MHz) under a pressure of 1.0 Pa. Under this condition, there are formed the conductive layers 118 to 121 of a second shape. The end portions thereof are tapered, and the thicknesses gradually increase from the ends toward the inside. The rate of isotropic etching increases in proportion to a decrease in the bias voltage applied to the side of the substrate as compared to the first etching treatment, and the angle of the tapered portions becomes 30 to 60°. The mask 108 is ground at the edge by etching to form a mask 122. In the step of FIG. 1D, the surface of the gate insulating film 106 is etched by about 40 nm.

Then, the doping is effected with an impurity element for imparting the n-type under the condition of an increased acceleration voltage by decreasing the dosage to be smaller than that of the first doping treatment. For example, the acceleration voltage is set to be from 70 to 120 keV, the dosage is set to be $1 \times 10^{13}/cm^2$ thereby to form first impurity regions 124 to 127 having an increased impurity concentration, and second impurity regions 128 to 131 that are in contact with the first impurity regions 124 to 127. In this step, the impurity may turn down to the lower side of the conductive layers 118 to 121 of the second shape, and the second impurity regions 128 to 131 may be overlapped with the conductive layers 118 to 121 of the second shape. The impurity concentration in the second impurity regions is from $1 \times 10^{17}$ to $1 \times 10^{20}$ atoms/cm$^3$, preferably, $1 \times 10^{16}$ to $1 \times 10^{18}$ atoms/cm$^3$ (FIG. 2A, the second doping processing).

Referring to FIG. 2B, impurity regions 133 (133a, 133b) and 134 (134a, 134b) of the conductive type opposite to the one conductive type are formed in the semiconductor layers 102 and 105 that form the p-channel TFTs. In this case, too, an impurity element for imparting the p-type is added using the electrically conductive layers 118 and 121 of the second shape as masks to form impurity regions in a self-aligned manner. At this moment, the semiconductor layers 103 and 104 forming the n-channel TFTs are entirely covered for their surfaces by forming a mask 132 of a resist. Here, the impurity region 133 and the impurity region 134 are formed by the ion doping method by using diborane (B$_2$H$_6$). The impurity element for imparting the p-type is added to the impurity region 133 and the impurity region 134 at a concentration of from $2 \times 10^{20}$ to $2 \times 10^{21}$ atoms/cm$^3$.

If closely considered, however, the impurity regions 133 and 134 can be divided into two regions containing an impurity element that imparts the n-type. Third impurity regions 133a and 134a contain the impurity element that imparts the n-type at a concentration of from $1 \times 10^{20}$ to $1 \times 10^{21}$ atoms/cm$^3$ and fourth impurity regions 133b and 134b contain the impurity element that imparts the n-type at a concentration of from $1 \times 10^{17}$ to $1 \times 10^{20}$ atoms/cm$^3$. In the impurity regions 133b and 134b, however, the impurity element for imparting the p-type is contained at a concentration of not smaller than $1 \times 10^{19}$ atoms/cm$^3$ and in the third impurity regions 133a and 134a the impurity element for imparting the p-type is contained at a concentration which is 1.5 to 3 times as high as the concentration of the impurity element for imparting the n-type. Therefore, the third impurity regions work as source regions and drain regions of the p-channel TFTs without arousing any problem. Note, reference numerals 102a-105a denote channel forming regions of respective TFTs.

Referring next to FIG. 2C, a first interlayer insulating film 137 is formed on the electrically conductive layers 118 to 121 of the second shape and on the gate insulating film 106. The first interlayer insulating film 137 may be formed of a silicon oxide film, a silicon oxynitride film, a silicon nitride film, or a laminated layer film of a combination thereof. In any case, the first interlayer insulating film 137 is formed of an inorganic insulating material. The first interlayer insulating film 137 has a thickness of 100 to 200 nm. When the silicon oxide film is used as the first interlayer insulating film 137, TEOS and O$_2$ are mixed together by the plasma CVD method, and are reacted together under a pressure of 40 Pa at a substrate temperature of 300 to 400° C. while discharging the electric power at a high frequency (13.56 MHz) and at a power density of 0.5 to 0.8 W/cm$^2$. When the silicon oxynitride film is used as the first interlayer insulating film 137, this silicon oxynitride film may be formed from SiH$_4$, N$_2$O and NH$_3$, or from SiH$_4$ and N$_2$O by the plasma CVD method. The conditions of formation in this case are a reaction pressure of from 20 to 200 Pa, a substrate temperature of from 300 to 400° C. and a high frequency (60 MHz) power density of from 0.1 to 1.0 W/cm$^2$. As the first interlayer insulating film 137, further, there may be used a hydrogenated silicon oxynitride film formed by using SiH$_4$, N$_2$O and H$_2$. The silicon nitride film, too, can similarly be formed by using SiH$_4$ and NH$_3$ by the plasma CVD method.

Then, a step is conducted for activating the impurity elements that impart the n-type and the p-type added at their respective concentrations. This step is conducted by thermal annealing method using an annealing furnace. There can be further employed a laser annealing method or a rapid thermal annealing method (RTA method). The thermal annealing method is conducted in a nitrogen atmosphere containing oxygen at a concentration of not higher than 1 ppm and, preferably, not higher than 0.1 ppm at from 400 to 700° C. and, typically, at from 500 to 600° C. In this embodiment, the heat treatment is conducted at 550° C. for 4 hours. When a plastic substrate having a low heat resistance temperature is used as the substrate 100, it is desired to employ the laser annealing method.

Following the step of activation, the atmospheric gas is changed, and the heat treatment is conducted in an atmosphere containing 3 to 100% of hydrogen at from 300 to 450° C. for from 1 to 12 hours to hydrogenate the semiconductor layer. This step is to terminate the dangling bonds of $10^{16}$ to $10^{18}/cm^3$ in the semiconductor layer with hydrogen that is thermally excited. As another means of hydrogenation, the plasma hydrogenation may be executed (using hydrogen excited with plasma). In any way, it is desired that the defect density in the semiconductor layers 102 to 105 is suppressed to be not larger than $10^{16}/cm^3$. For this purpose, hydrogen may be added in an amount of from 0.01 to 0.1 atomic %.

Then, a second interlayer insulating film made of an organic insulator material is formed with an average film thickness of 1.0 μm to 2.0 μm by a spin coat method. In this embodiment, a carbon black (CK-7800; produced by Fuji Film Olin Co. Ltd.) as a negative type photosensitive resin is used. However, any insulating film having a high light absorption property may be used.

After that, a resist mask having a predetermined pattern is formed and then contact holes which reach the impurity regions that are formed in the respective semiconductor layers and are the source region or the drain region are formed. The contact holes are formed by a dry etching method. In this case, a mixed gas of CF$_4$, O$_2$, and He is used as an etching gas and the second interlayer insulating film made of an organic resin material is etched first. Successively, the first interlayer insulating film 137 is etched using CF$_4$ and O$_2$ as etching gases. Further, the etching gas is changed to CHF$_3$ in order to increase a selection ratio to the semiconductor layer and a third-shaped gate insulating film is etched. Thus, the contact holes and the opening can be formed. In this way, second interlayer insulating films 139a and 139b are formed.

Then, a conductive metallic film is formed by a sputtering method or a vacuum evaporation method, patterned using a photo mask, and then etched to form source wirings 140 to 143 and drain wirings 144 to 146. Although not shown, these wirings each are made from a laminate film of a Ti film having a film thickness of 50 nm and an alloy film (alloy film of Al and Ti) having a film thickness of 500 nm.

Next, transparent protrusions 164 are formed on the first interlayer insulating film 137 and between the second interlayer insulating films 139a and 139b (in the opening) by exposure and development using a photo mask. Here, a photosensitive acrylic resin is used as a material for forming the transparent protrusions. However, any transparent material may be used. Also, a shape of the protrusion and the number thereof are not limited.

NN700 (produced by JSR) which is a material containing mainly a photosensitive acrylic resin is used as a material of the transparent protrusions 164. A film thickness is set to become about 0.7 µm to 1.2 µm after baking. After NN700 is formed and prebaked, it is exposed using a photo mask with a mask aligner. That is, the acrylic resin is exposed through the opening of the photo mask. Then, it is developed using a developer containing mainly TMAH (tetramethyl ammonium hydroxide) and baked at 250° C. for 1 hour. As a result, the transparent protrusions 164 is formed as shown in FIG. 3B. The height of the transparent protrusions 164 becomes about 0.5 µm to 1.0 µm after baking.

Note that the transparent protrusions 164 may be formed before the formation of the source wirings 140 to 143 and the drain wirings 144 to 146.

Then, a transparent conductive film is formed on the transparent protrusions with a thickness of 80 nm to 120 nm and patterned to form a pixel electrode 147 (FIG. 4A). Note that, in this embodiment, an indium tin oxide (ITO) film or a transparent conductive film in which indium oxide is mixed with 2% to 20% of zinc oxide (ZnO) is used as the transparent electrode.

When the pixel electrode 147 is formed in contact with the drain wiring 146 and overlapped therewith, it is electrically connected with the drain region of a current control TFT.

Next, as shown in FIG. 4B, a third interlayer insulating film 149 is formed. In this embodiment, the third interlayer insulating film 149 is formed using a resist. However, any film having an insulating property may be used. Polyimide, polyamide, an acrylic resin, BCB (benzocyclobutene), a silicon oxide film, or the like can be also used.

In this embodiment, a thickness of the third interlayer insulating film 149 is set to be about 1 µm and the opening is formed so as to be narrower as it is approached to the pixel electrode 147, that is, so as to become a so-called inverse taper shape. This is formed as follows. That is, after a resist is formed, a region except a region in which the opening is to be formed is covered with a mask, UV light is irradiated for exposure, and the exposed region is removed using a developer.

Next, an organic layer 150 is formed in an inert gas (nitrogen or noble gas) atmosphere by a vacuum evaporation method and further a cathode (MgAg electrode) 151 is formed by a vacuum evaporation method. The succeeding processes are performed in an inert gas (nitrogen or noble gas) atmosphere. It is desirable that thermal treatment is performed for the pixel electrode 147 to completely remove moisture before the formation of the organic layer 150 and the cathode 151.

Note that a known material can be used for the organic layer 150. In this embodiment, a two layered structure made from the hole transporting layer and the light emitting layer is used for the organic layer. However, there is the case where any one of the hole injecting layer, the electron injecting layer, and the electron transporting layer is provided. Various examples with respect to such a combination have already been reported and any structure thereof may be used.

In this embodiment, the hole transporting layer is formed by an evaporation method using polyphenylenvinylene. Also, the light emitting layer is formed by an evaporation method using polyvinylcarbazole to which 30 to 40% of PBD of 1,3,4-oxadiazole derivative is molecular-dispersed. About 1% of coumarin 6 is added thereto as a light emitting center of a green color.

The film thickness of the organic layer 150 is desirably set to be 10 nm to 400 nm (typically, 60 nm to 150 nm) and the thickness of the cathode 151 is desirably set to be 80 nm to 200 nm (typically, 100 nm to 150 nm).

Note that, in this embodiment, the MgAg electrode is used as the cathode of the light emitting element. However, other known materials may also be used. When a material having a high light reflecting property is used, an effect due to the structure of the light emitting device of this embodiment is exhibited.

Also, in order to reduce resistance, a protective electrode may be formed on the cathode 151. A material of the protective electrode is typically a metallic film containing mainly aluminum. Of course, other materials may also be used. Further, a protective film may be provided in order to protect the organic layer 150 and the cathode 151 from moisture and oxygen. After the formation of the protective electrode, the protective film may be successively formed without exposing it to air.

Next, a sealing substrate 166 is bonded to the resultant substrate 100 through a seal member (not shown) and cut into a predetermined size. Thus, the light emitting device shown in FIG. 5 is completed. A region surrounded by the substrate 100, the sealing substrate 166, the seal member, the cathode 151, and the interlayer insulating film 149 is filled with an inert gas 167. Note that a region in which the pixel electrode 147, the organic layer 150, and the cathode 151 are overlapped with one another corresponds to the light emitting element.

The transparent protrusions 164 are provided in the light emitting device of this embodiment and a large number of uneven portions 165 are formed on the surface of the cathode 151 which is in contact with the organic layer 150. Thus, incident light 172 from the outside is diffused and reflected and the direction of the reflecting light 173 becomes random. Therefore, the copy-in becomes invisible to the observer.

Also, since the insulating film having a high light absorption property is provided in the transverse direction of the transparent protrusions 164, the reflecting light from the cathode, the source wiring, the drain wiring, and the like is suppressed and the reflection of light can be prevented. Thus, the copy-in is invisible to the observer. Note that, in the case where the insulating film having a high light absorption property is applied, there is an effect in that the reflecting light is suppressed and the reflection of light is prevented, as compared with the case where the surface of the cathode is made to be uneven.

Embodiment 2

In this embodiment, a method of manufacturing an active matrix substrate different from Embodiment 1will be described using FIG. 6A to FIG. 8. Although the transparent protrusions are formed on the first interlayer insulating film in order to form the uneven portion in the cathode in Embodiment 1, this embodiment is characterized in that transparent protrusions are formed on the second interlayer insulating film.

Here, a method of simultaneously manufacturing a switching TFT 262 and a current control TFT 263 in a pixel portion 271 and TFTs (p-channel TFT 260 and n-channel TFT 261) in a driver circuit 270 provided in the periphery of the pixel portion 271 will be described in detail.

Note that, since the other structure has already been described in Embodiment 1, Embodiment 1 is referred to with respect to a detailed structure and the description is omitted here.

First, the same state as in FIG. 2B is obtained in accordance with Embodiment 1. Then, a first interlayer insulating film 237 is formed.

Figure 6A:
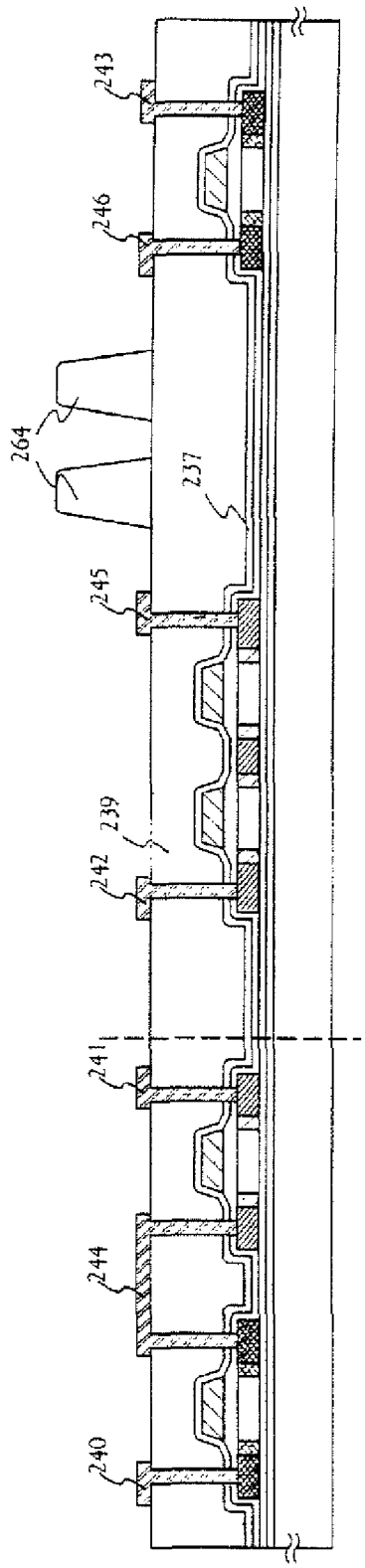
FIGS. 6A and 6B show manufacturing steps of the light emitting device of Embodiment 2.

Then, as shown in FIG. 6A, a second interlayer insulating film 239 made of an organic insulator material is formed with an average film thickness of 1.0 µm to 2.0 µm first. Polyimide, an acrylic resin, polyamide, polyimideamide, BCB (benzocyclobutene), or the like can be used as the organic resin material. For example, when polyimide such as that applied to a substrate and then thermally polymerized is used, it is baked at 300° C. in a clean oven to form the second interlayer insulating film. Also, in the case of using acrylic, a two-fluid material is used. A main material and a curing agent are mixed and the mixture is applied onto the entire surface of the substrate with a spinner. Then, preheating is performed at 80° C. for 60 seconds in a hot plate and baking is performed at 250° C. for 60 minutes in the clean oven. Thus, the second interlayer insulating film 239 can be formed.

After that, a resist mask having a predetermined pattern is formed and then contact holes which reach the impurity regions that are formed in the respective semiconductor layers and are the source region or the drain region are formed. The contact holes are formed by a dry etching method. In this case, a mixed gas of $CF_4$, $O_2$, and He is used as an etching gas and the second interlayer insulating film 239 made of an organic resin material is etched first. Successively, the first interlayer insulating film 237 is etched using $CF_4$ and $O_2$ as etching gases. Further, the etching gas is changed to $CHF_3$ in order to increase a selection ratio to the semiconductor layer and a third-shaped gate insulating film is etched. Thus, the contact holes can be formed.

Then, a conductive metallic film is formed by a sputtering method or a vacuum evaporation method, patterned using a photo mask, and then etched to form source wirings 240 to 243 and drain wirings 244 to 246. Although not shown, these wirings each are made from a laminate film of a Ti film having a film thickness of 50 nm and an alloy film (alloy film of Al and Ti) having a film thickness of 500 nm.

Next, transparent protrusions 264 are formed on the second interlayer insulating film 239 by exposure and development using a photo mask. Here, any transparent material may be used as a material for forming the transparent protrusions. Also, a shape of the protrusion and the number thereof are not limited.

NN700 (produced by JSR) which is a material containing mainly a photosensitive acrylic resin is used as a material of the transparent protrusions 264. A film thickness is set to becomes about 0.7 µm to 1.2 µm after baking. After NN700 is formed and prebaked, it is exposed using a photo mask with a mask aligner. That is, the acrylic resin is exposed through the opening of the photo mask. Then, it is developed using a developer containing mainly TMAH (tetramethyl ammonium hydroxide) and a dried substrate is baked at 250° C. for 1 hour. As a result, the transparent protrusions 264 is formed as shown in FIG. 6A. The height of the transparent protrusions 264 becomes about 0.5 µm to 1.0 µm after baking. In this embodiment, the photosensitive acrylic resin is used as a material of the protrusions. However, the material of the protrusions may be any transparent material. Also, a shape of the protrusion and the number thereof are not limited.

Note that the transparent protrusions 264 may be formed before the formation of the source wirings 240 to 243 and the drain wirings 244 to 246.

Figure 6B:
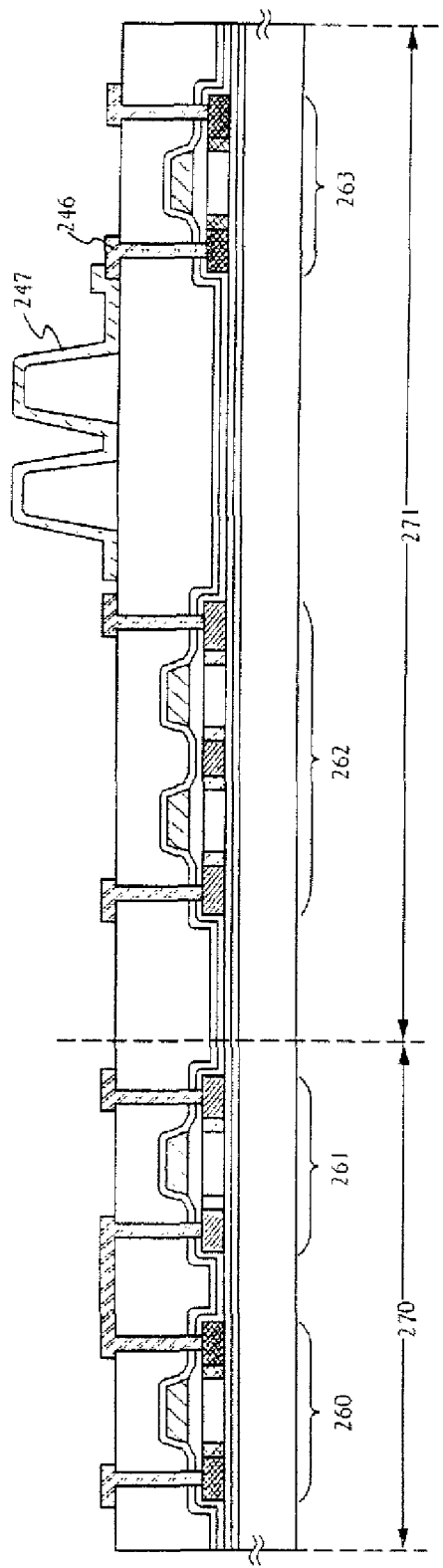

Then, as shown in FIG. 6B, a transparent conductive film is formed on the transparent protrusions with a thickness of 80 nm to 120 nm and patterned to form a pixel electrode 247. Note that, in this embodiment, an indium tin oxide (ITO) film or a transparent conductive film in which indium oxide is mixed with 2% to 20% of zinc oxide (ZnO) is used as the transparent electrode.

When the pixel electrode 247 is formed in contact with the drain wiring 246 and overlapped therewith, it is electrically connected with the drain region of the current control TFT 263.

Next, as shown in FIG. 7A, third interlayer insulating films 249a and 249b are formed. In this embodiment, a third interlayer insulating film 249 made from the third interlayer insulating films 249a and 249b is formed using a carbon black (CK-7800; produced by Fuji Film Olin Co. Ltd.). However, any material having a light shielding property and an insulating property may be used.

The thickness of the third interlayer insulating film 249 is set to be about 1 µm and the opening is formed so as to be narrower as it is approached to the pixel electrode 247, that is, so as to become a so-called inverse taper shape. This is formed as follows. That is, after a resist is formed, a region in which the opening is to be formed is covered with a mask, UV light is irradiated for exposure, and the exposed region is removed using a developer.

Next, an organic layer 250 is formed in an inert gas (nitrogen or noble gas) atmosphere by an evaporation method and further a cathode (MgAg electrode) 251 is formed by an evaporation method. The succeeding processes are performed in an inert gas (nitrogen or noble gas) atmosphere. It is desirable that thermal treatment is performed for the pixel electrode 247 to completely remove moisture before the formation of the organic layer 250 and the cathode 251.

Note that a known material can be used for the organic layer 250. In this embodiment, a two layered structure made from the hole transporting layer and the light emitting layer is used for the organic layer. However, there is the case where any one of the hole injecting layer, the electron injecting layer, and the electron transporting layer is provided. Various examples with respect to such a combination have already been reported and any structure thereof may be used.

In this embodiment, the hole transporting layer is formed by an evaporation method using polyphenylenvinylene. Also, the light emitting layer is formed by an evaporation method using polyvinylcarbazole to which 30 to 40% of PBD of 1,3,4-oxadiazole derivative is molecular-dispersed. About 1% of coumarin 6 is added thereto as a light emitting center of a green color.

The film thickness of the organic layer 250 is desirably set to be 10 nm to 400 nm (typically, 60 nm to 150 nm) and the thickness of the cathode 251 is desirably set to be 80 nm to 200 nm (typically, 100 nm to 150 nm).

Note that, in this embodiment, the MgAg electrode is used as the cathode of the light emitting element. However, other known materials may also be used. When a material having a high light reflecting property is used, an effect due to the structure of the light emitting device of this embodiment is exhibited.

Also, in order to reduce resistance, a protective electrode may be formed on the cathode 251. A material of the protective electrode is typically a metallic film containing mainly aluminum. Of course, other materials may also be used. Further, a protective film may be provided in order to protect the organic layer 250 and the cathode 251 from moisture and oxygen. After the formation of the protective electrode, the protective film may also be successively formed without exposing it to air. (FIG. 7B)

Next, a sealing substrate 266 is bonded to the resultant substrate 200 through a seal member (not shown) and cut into a predetermined size. Thus, the light emitting device shown in FIG. 8 is completed. A region surrounded by the substrate 200, the sealing substrate 266, the seal member, the cathode 251, and the interlayer insulating film 249 is filled with an inert gas 267. Note that a region in which the pixel electrode 247, the organic layer 250, and the cathode 251 are overlapped with one another corresponds to the light emitting element.

When the transparent protrusions 264 are provided in the light emitting device of the present invention, a large number of uneven portions 265 are formed on the surface of the cathode 251 which is in contact with the organic layer 250. Thus, incident light 272 from the outside is diffused and reflected and the direction of the reflecting light 273 becomes random. Therefore, the copy-in becomes invisible to the observer.

Also, since the insulating film having a high light absorption property is provided in the transverse direction of the transparent protrusions 264, the reflecting light from the cathode, the source wiring, the drain wiring, and the like is suppressed and the reflection of light can be prevented. Thus, the copy-in is invisible to the observer. Note that, in the case where the insulating film having a high light absorption property is applied, there is an effect in that the reflecting light is suppressed and the reflection of light is prevented, as compared with the case where the surface of the cathode is made to be uneven.

Embodiment 3

In this embodiment, a method of manufacturing an active matrix substrate different from Embodiments 1 and 2 will be described using FIG. 9A to FIG. 11. Although the acrylic resin is used to form the uneven portion in the cathode in Embodiments 1 and 2, this embodiment is characterized in that a microlens is formed therein.

Here, a method of simultaneously manufacturing a switching TFT 362 and a current control TFT 363 in a pixel portion 371 and TFTs (p-channel TFT 360 and n-channel TFT 361) in a driver circuit 370 provided in the periphery of the pixel portion 371 will be described in detail.

Note that, since the other structure has already been described in Embodiment 1, Embodiment 1 is referred to with respect to a detailed structure and the description is omitted here.

Figure 3A:
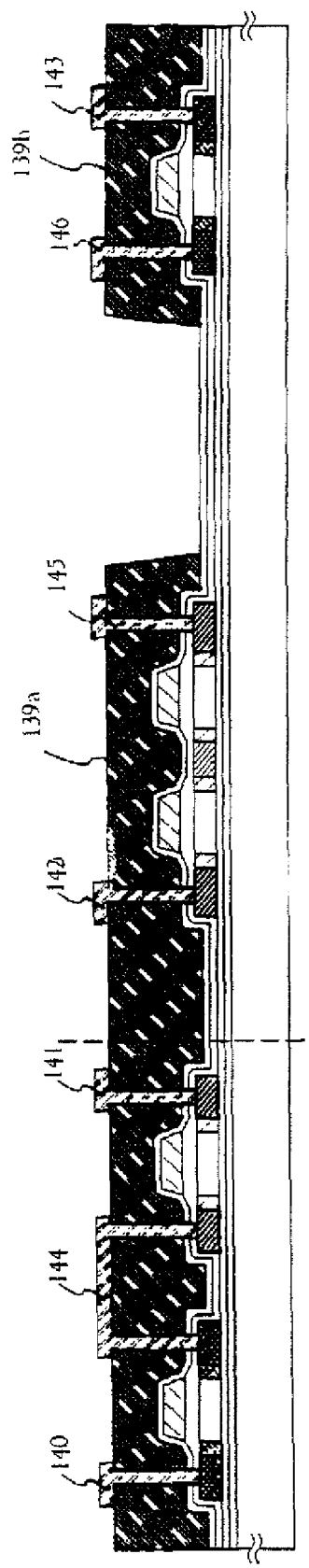
FIGS. 3A and 3B show manufacturing steps of the tight emitting device of Embodiment 1.
Figure 3B:
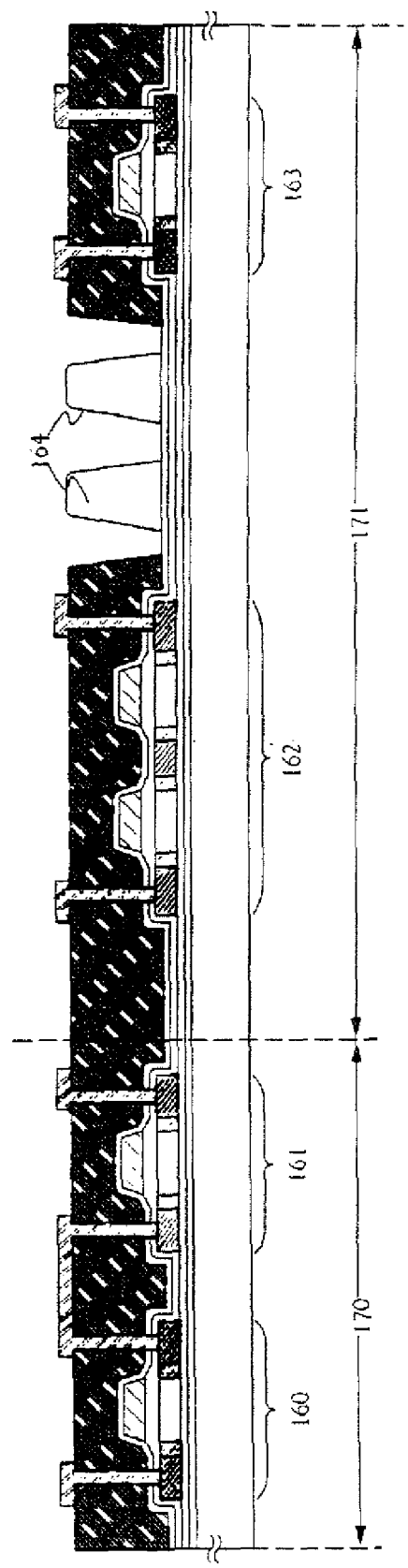
Figure 9A:
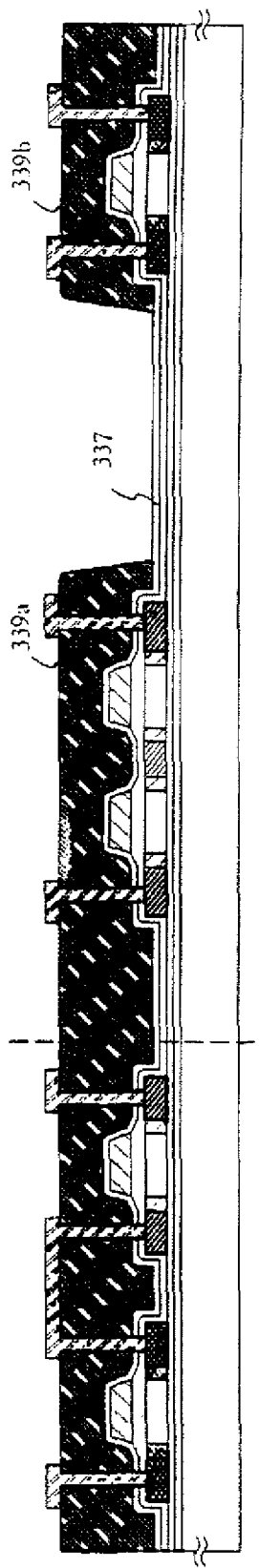
FIGS. 9A and 9B show manufacturing steps of a light emitting device of Embodiment 3.

First, the same state as in FIG. 3A is obtained in accordance with Embodiment 1. Second interlayer insulating films 339a and 339b are formed. (FIG. 9A)

Next, a positive type photosensitive resin (produced by Hoechst AG corporation; AZ-1350) is applied by a spin coat method. Exposure (the amount of irradiation: 100 mJ/cm$^2$) is performed through a photo mask having a plurality of circular openings. After that development is performed using a developer (produced by Hoechst AG corporation; AZ-developer) to obtain a cylindrical photosensitive resin located on the first interlayer insulating film 337 and between the second interlayer insulating films 339a and 339b.

Figure 9B:
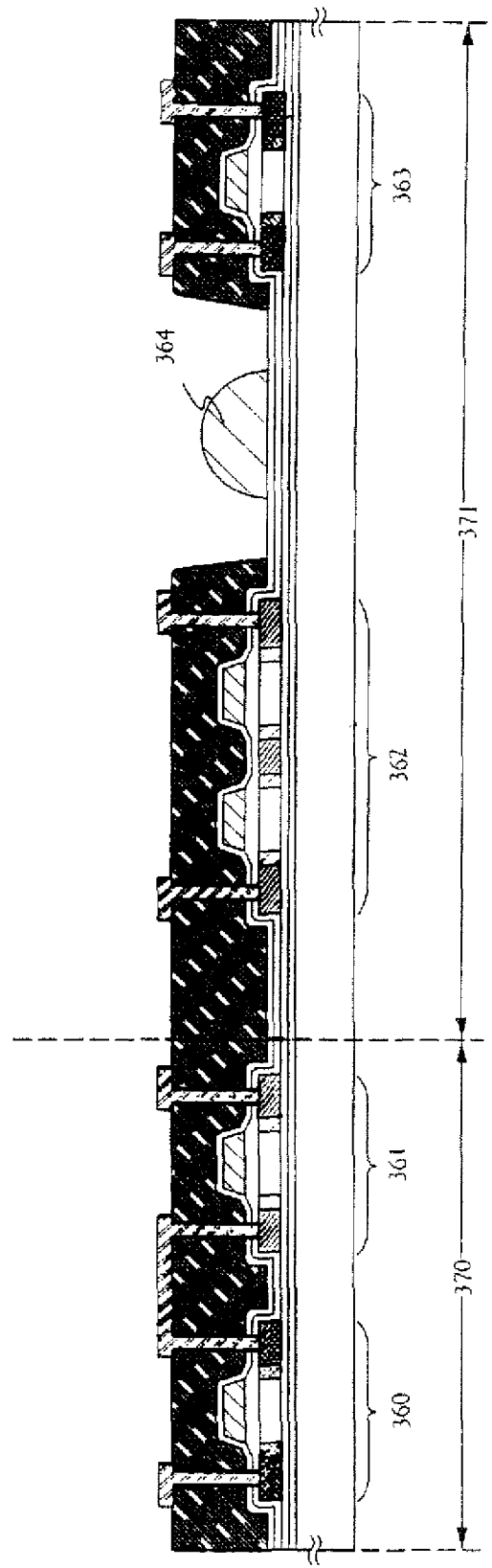

Next, the cylindrical photosensitive resin is kept at 200° C. for 60 minutes in a clean oven. It is melted to form a microlens 364 having a convex shape. Here, any transparent material may be used as a material for forming the microlens. Also, a shape of the microlens and the number thereof are not limited. (FIG. 9B)

Then, a transparent conductive film is formed on the microlens at a thickness of 80 nm to 120 nm and patterned to form a pixel electrode 347. Note that, in this embodiment, an indium tin oxide (ITO) film or a transparent conductive film in which indium oxide is mixed with 2% to 20% of zinc oxide (ZnO) is used as the transparent electrode.

Figure 10A:
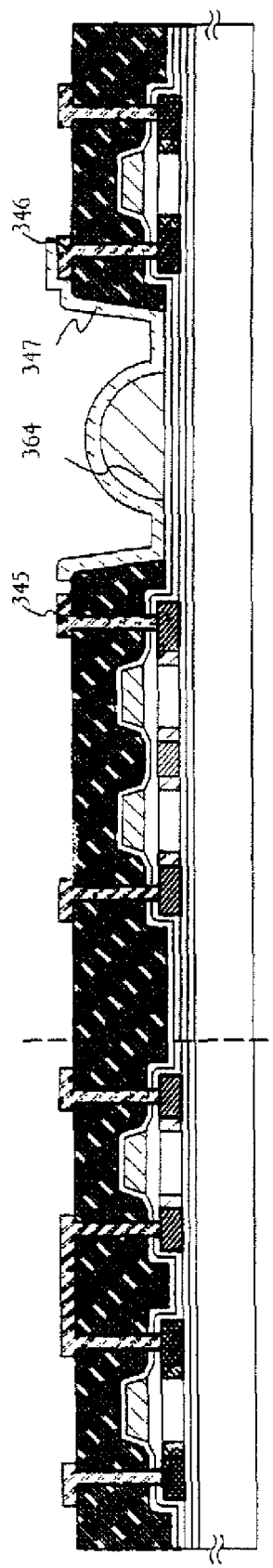
FIGS. 10A to 10B show manufacturing steps of the light emitting device of Embodiment 3.

When the pixel electrode 347 is formed in contact with the drain wiring 346 and overlapped therewith, it is electrically connected with the drain region of the current control TFT 363. Note, reference numeral 352 indicates a drain electrode of the switching TFT 352. (FIG. 10A)

In this embodiment, the thickness of the third interlayer insulating film 349 is set to be about 1 μm and the opening is formed so as to be narrower as it is approached to the pixel electrode 347, that is, so as to become a so-called inverse taper shape. This is formed as follows. That is, after a resist is formed, a region except a region in which the opening is to be formed is covered with a mask, UV light is irradiated for exposure, and the exposed region is removed using a developer.

Note that, in this embodiment, a film made of a resist is used as the third interlayer insulating film 349. However, in some cases, polyimide, polyamide, an acrylic resin, BCB (benzocyclobutene), a silicon oxide film, or the like can also be used. In the case of a substance having an insulating property, the third interlayer insulating film 349 is made of either an organic substance or an inorganic substance.

Next, an organic layer 350 is formed by an evaporation method. At this time, it is desirable that thermal treatment is performed for the pixel electrode 347 to completely remove moisture before the formation of the organic layer 350 and the cathode 351.

Note that a known material can be used for the organic layer 350. In this embodiment, a two layered structure made from the hole transporting layer and the light emitting layer is used for the organic layer. However, there is the case where any one of the hole injecting layer, the electron injecting layer, and the electron transporting layer is provided. Various examples with respect to such a combination have already been reported and any structure thereof may be used.

In this embodiment, the hole transporting layer is formed by an evaporation method using polyphenylenvinylene. Also, the light emitting layer is formed by an evaporation method using polyvinylcarbazole to which 30 to 40% of PBD of 1,3,4-oxadiazole derivative is molecular-dispersed. About 1% of coumarin 6 is added thereto as a luminescence center of a green color.

Note that, the film thickness of the organic layer 350 is desirably set to be 10 nm to 400 nm (typically, 60 nm to 150 nm) and the thickness of the cathode 351 is desirably set to be 80 nm to 200 nm (typically, 100 nm to 150 nm).

Note that, in this embodiment, the MgAg electrode is used as the cathode of the light emitting device. However, other known materials may also be used. When a material having a high light reflecting property is used, an effect due to the structure of the tight emitting device of this embodiment mode is exhibited.

Also, a protective electrode may be provided in order to protect the organic layer 350 from moisture and oxygen. Further, a protective film may be provided. After the formation of the protective electrode, the protective film may be successively formed without exposing it to air.

Figure 10B:
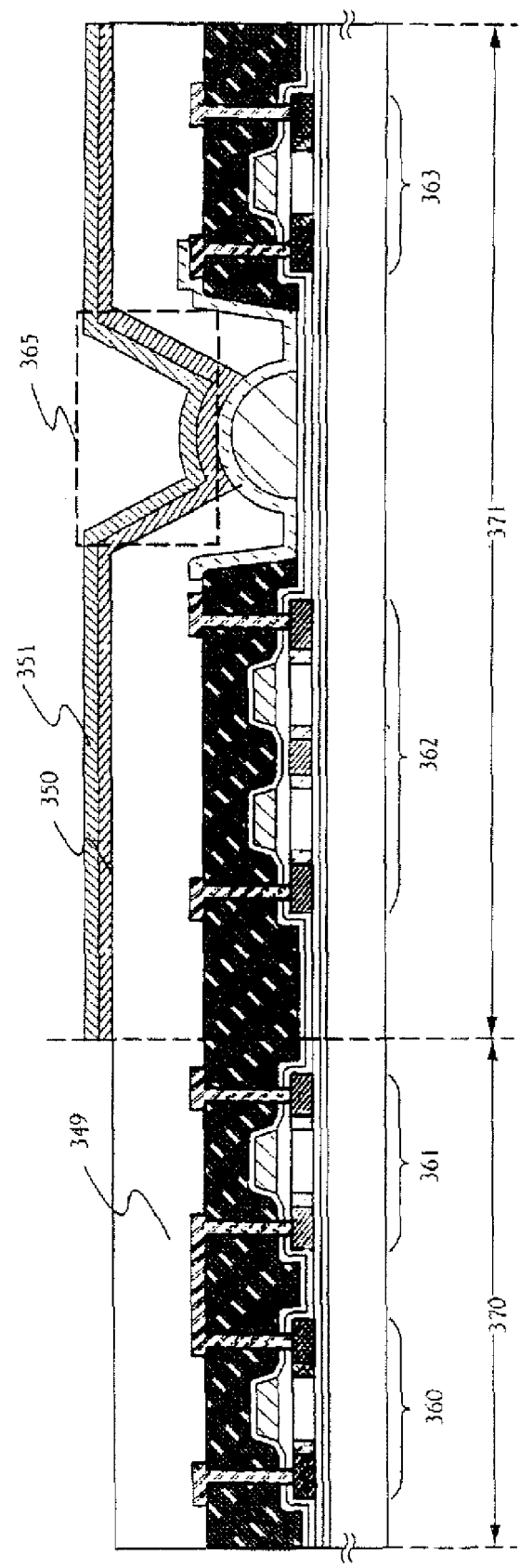

The protective electrode is provided in order to prevent the deterioration of the cathode, and is typically made of a metallic film containing mainly aluminum. Of course, other materials may also be used. Also, since the organic layer 350 and the cathode 351 are very sensitive to moisture, it is desirable that steps up through the formation of the protective electrode are performed in succession without air exposure to protect the organic layer from the outside air. (FIG. 10B)

Next, a sealing substrate 366 is bonded to the resultant substrate through a seal member (not shown) and cut into a predetermined size. Thus, the light emitting device shown in FIG. 11 is completed. A region surrounded by the substrate 300, the sealing substrate 366, a seal member (not shown), the cathode 351, and the interlayer insulating film 349 is filled with an inert gas 367. Note that a region in which the pixel electrode 347, the organic layer 350, and the cathode 351 are overlapped with one another corresponds to the light emitting element.

The microlens 364 is provided in the light emitting device of this embodiment and a large number of uneven portions 365 are formed on the surface of the cathode 351 which is in contact with the organic layer 350. Thus, incident light 372 from the outside is diffused and reflected and the direction of the reflecting light 373 becomes random. Therefore, the copy-in becomes invisible to the observer.

Embodiment 4

The light-emitting display device of the present invention is a self light emitting type, therefore compared to a liquid crystal display, it has excellent visible properties and is broad in an angle of visibility. Accordingly, the light-emitting display device can be applied to a display portion in various electric devices. For example, in order to view a TV program or the like on a large-sized screen, the light-emitting display device in accordance with the present invention can be used as a display portion of a light-emitting display having a diagonal size of 30 inches or larger (typically 40 inches or larger).

The display includes all kinds of displays to be used for displaying information, such as a display for a personal computer, a display for receiving a TV broadcasting program, a display for advertisement display. Moreover, the light-emitting device in accordance with the present invention can be used as a display portion of other various electric devices.

As other electric equipments of the present invention there are: a video camera; a digital camera; a goggle type display (head mounted display); a navigation system; a sound reproduction device (a car audio stereo and an audio set and so forth); a notebook type personal computer; a game apparatus; a car mounted backward confirmation monitor; a TV telephone; a portable information terminal (such as a mobile computer, a portable telephone, a portable game machine, or an electronic book); and an image playback device equipped with a recording medium (specifically, device provided with a display portion which plays back images in a recording medium such as a digital versatile disk player (DVD), and displays the images). Specific examples of those electric equipments are shown in FIGS. 13A to 15D.

Figure 13A:
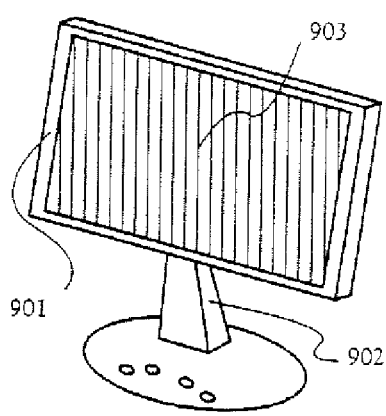
FIGS. 13A to 13F show electrical devices of Embodiment 4.

FIG. 13A shows a display device containing a casing 901, a support stand 902, and a display portion 903. The light-emitting device of the present invention can be used as the display portion 903. Such a light-emitting device is a self light emitting type so that a back light is not necessary. Thus, the display portion can be made thinner than that of a liquid crystal display.

Figure 13B:
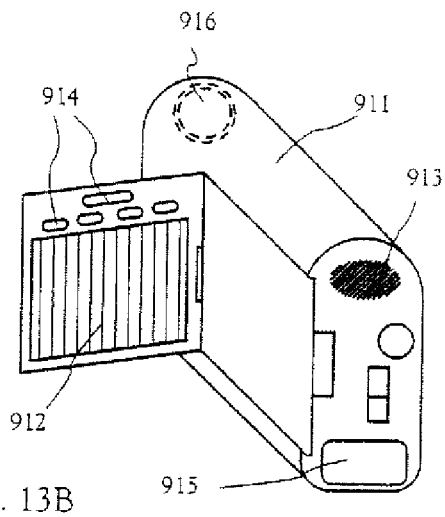

FIG. 13B shows a video camera, and contains a main body 911, a display portion 912, a sound input portion 913, operation switches 914, a battery 915, and an image receiving portion 916. The light-emitting device of the present invention can be used as the display portion 912.

Figure 13C:
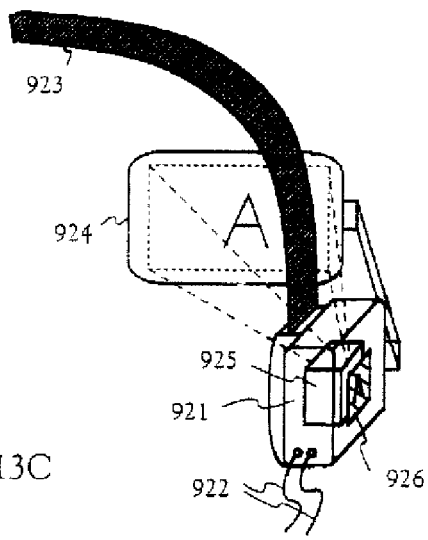

FIG. 13C shows a part of a head mounted display device (right handed side), and contains a main boy 921, a signal cable 922, a head fixation band 923, a display portion 924, an optical system 925 and a display device 926. The light-emitting device of the present invention can be used as the display device 926.

Figure 13D:
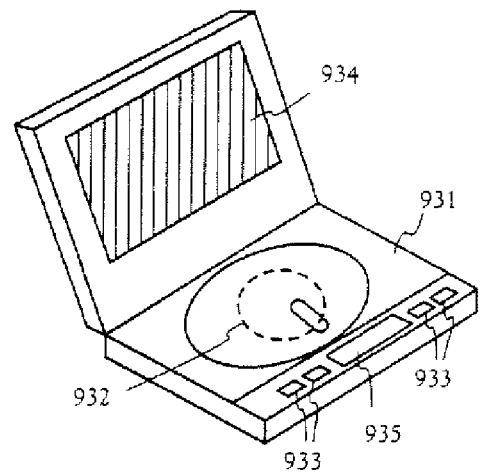

FIG. 13D is an image playback device equipped with a recording medium (specifically, a DVD playback device), and contains a main body 931, a recording medium (such as a DVD and so forth) 932, operation switches 933, a display portion (a) 934, and a display portion (b) 935. The display portion (a) 934 is mainly used for displaying image information. The display portion (b) 935 is mainly used for displaying character information. The light-emitting device of the present invention can be used as the display portion (a) 934 and as the display portion (b) 935. Note that the image playback device equipped with the recording medium includes devices such as domestic game machines.

Figure 13E:
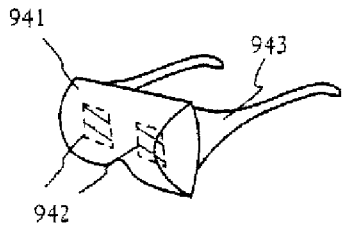

FIG. 13E shows a goggle type display device (a head mounted display device), and contains a main body 941, a display portion 942, and an arm portion 943. The light-emitting device of the present invention can be used as the display portion 942.

Figure 13F:
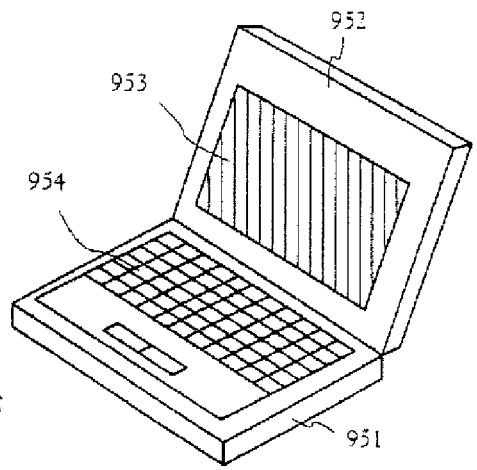

FIG. 13F is a personal computer, and contains a main body 951, a casing 952, a display portion 953, and a keyboard 954. The light-emitting device of the present invention can be used as the display portion 953.

Note that if the luminance of the organic layer of materials increases in the future, then it will become possible to use the light-emitting device of the present invention in a front type or a rear type projector by expanding and projecting light containing output image information with a lens or the like.

Further, the above electric devices display often information transmitted through an electronic communication circuit such as the Internet and CATV (cable TV), and particularly situations of displaying moving images is increasing. The response speed of the organic layer of materials is so high that the light-emitting device of the present invention are good for display of moving image.

Figure 14A:
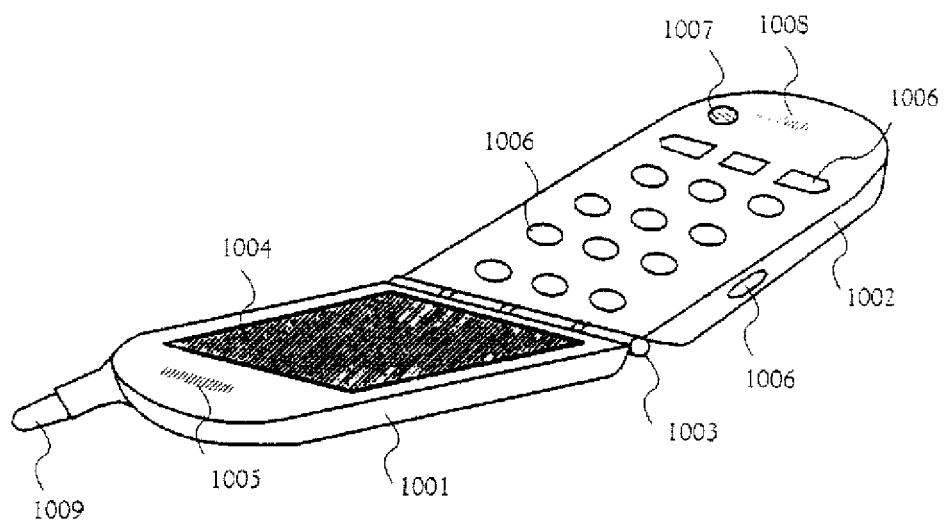
FIGS. 14A to 14C show electrical devices of Embodiment 4.

FIG. 14A shows a portable telephone, and contains a main body 1001, an operation panel 1002, a connecting portion 1003, a display portion 1004, a sound output portion 1005, an operation switches 1006, a power source switch 1007, a sound input portion 1008 and an antenna 1009. The light-emitting device of the present invention can be used as the display portion 1004. Note that by displaying white color characters in a black color background, the display portion 1004 can suppress the power consumption of the portable telephone.

Figure 14B:
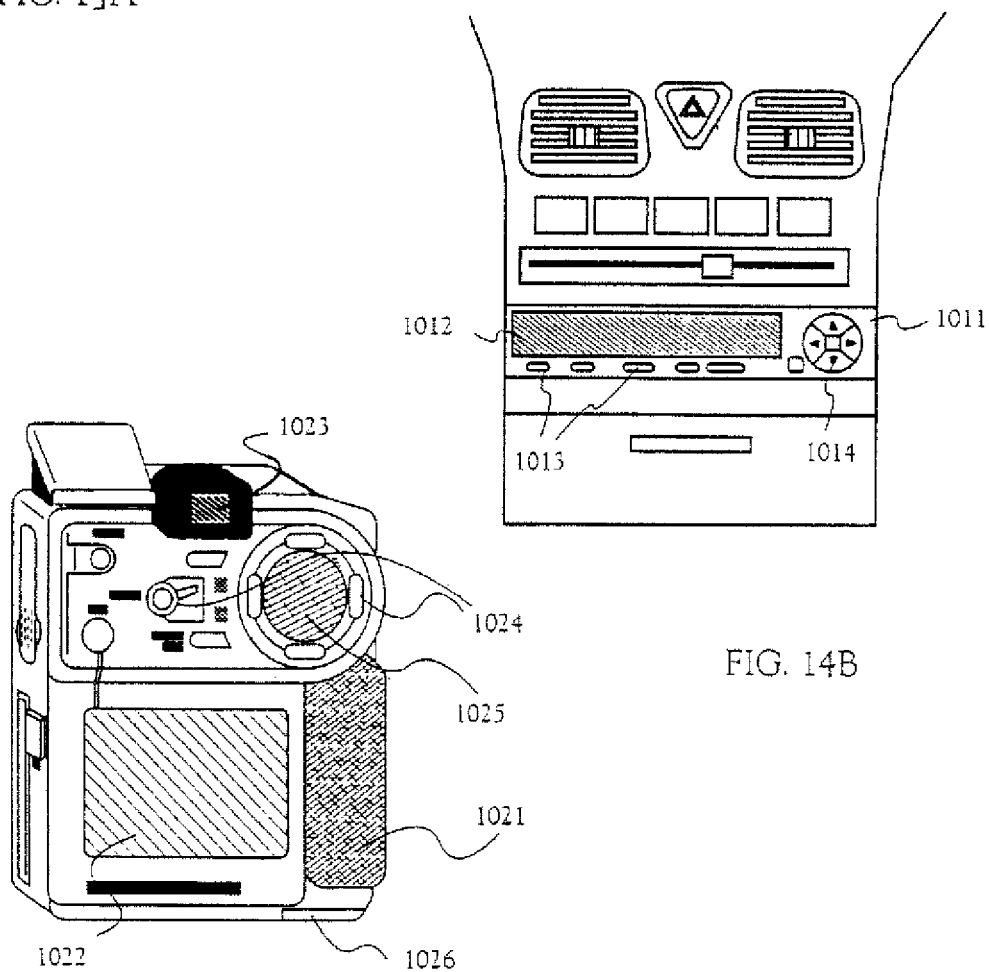

FIG. 14B shows a sound reproduction device, in a concrete term, a car audio stereo, and contains a main body 1011, a display portion 1012, and operation switches 1013 and 1014. The light-emitting device of the present invention can be used as the display portion 1012. Further, a car mounting audio stereo is shown in this embodiment mode, but a portable type or a domestic type sound reproduction device may also be used. Note that, the display portion 1012 can suppress the power consumption by displaying white color character in a black color background. Particularly it have an effect on the portable sound reproduction device.

Figure 14C:
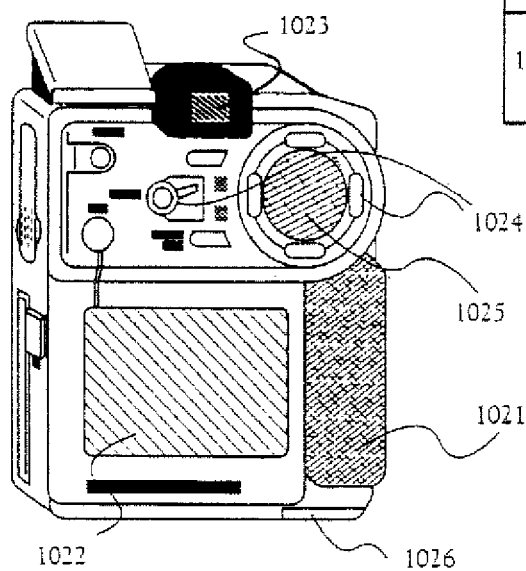
Figure 16:
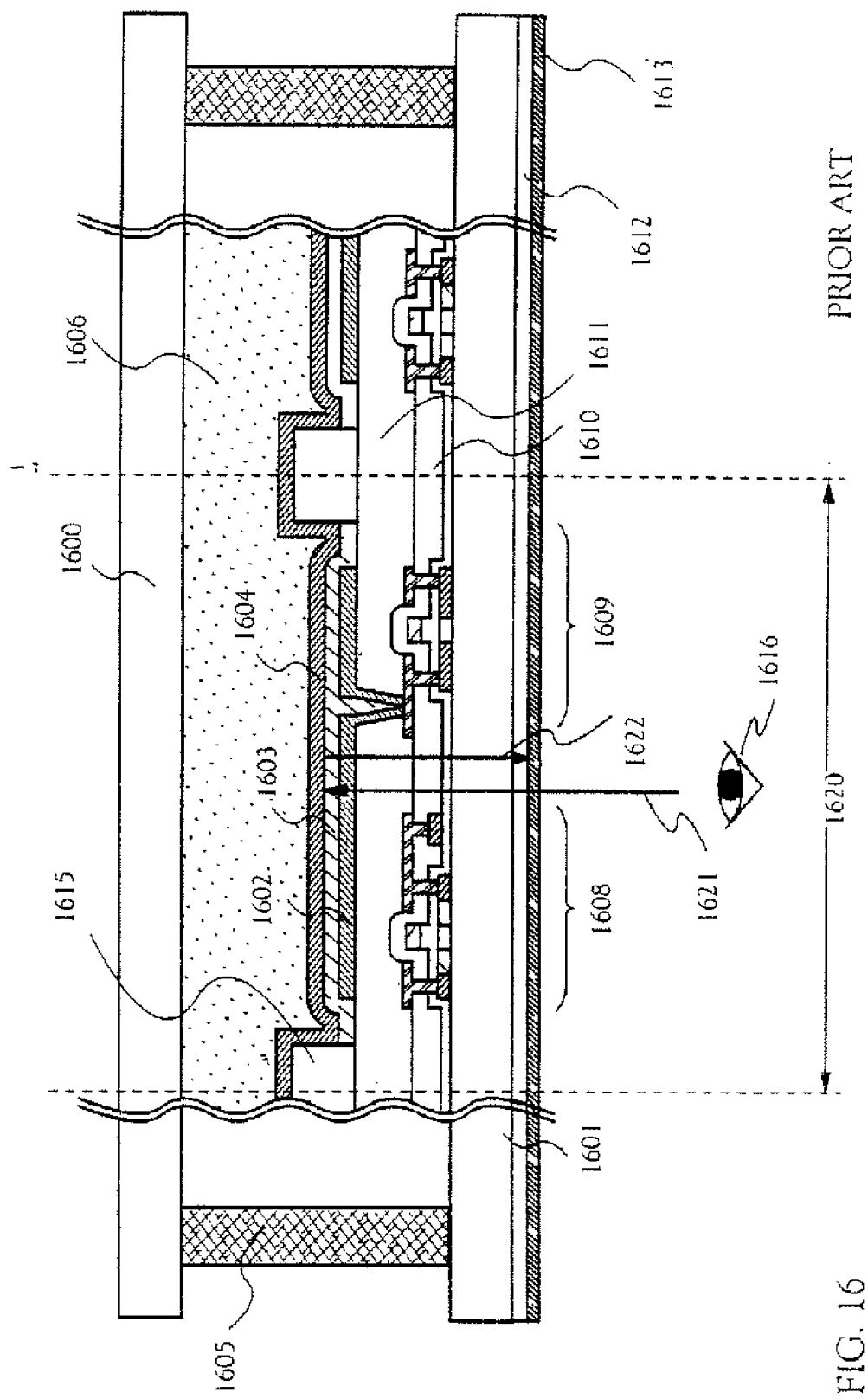
FIG. 16 is a cross sectional view of a conventional light emitting device.

FIG. 14C shows a digital camera, and contains a main body 1021, a display portion (A) 1022, an eye piece portion 1023, and an operation switches 1024, a display portion (B) 1025, a battery 1026. The light-emitting device of the present invention can be used as the display portion (A) 1022 and the display portion (B) 1025. Note that, in the case that the display portion (B) 1025 is used as the operation panel, the power consumption of the digital camera can suppress by displaying white color characters in a black color background.

FIG. 15A shows a car mounted backward confirmation monitor, and contains a main body 3201, a display portion 3202, a connecting portion with car 3203, a relay cable 3204, a camera 3205 and a mirror 3206. The light-emitting device of the present invention can be used as a display portion 3202. In this application, though a built-in type display portion 3202 in a mirror 3206 is shown, a separated type of that can be also used.

FIG. 15B shows a TV telephone, and contains a main body 3301, a display portion 3302, an image portion 3303, a keyboard 3304, an operation switch 3305 and a receiver 3306. The light-emitting device of the present invention can be used as a display portion 3303.

FIG. 15C shows a car navigation, and contains a main body 3401, a display portion 3402 and an operation switch 3403. The light-emitting device of the present invention can be used as a display portion 3402. An picture of the road or the like is shown in the display portion 3402.

FIG. 15D shows an electronic diary, and contains a main body 3501, a display portion 3502, an operation switch 3503 and an electronic pen 3504. The light-emitting device of the present invention can be used as a display portion 3502.

In the case of the portable electric device shown in this embodiment mode, the sensor portion is provided as a method of lowering the power consumption, which perceives the external light and functions to lower the brightness of display portion when it is used in the dark.

As described above, the application range of this invention is extremely wide, and it may be used for electric devices in various fields. Further, the electric device of this embodiment mode may be obtained by freely combining the structures of Embodiments 1 to 3.

When the surface of the cathode which is in contact with the organic layer of the light emitting device is made to be uneven, incident light from the outside is diffused and reflected and the direction of the reflecting light becomes random.

Also, since the insulating film having a high light shielding property is formed in the transverse direction of the transparent protrusions, the reflecting light from the cathode, the source wiring, the drain wiring, and the like is suppressed and the reflection of light can be prevented. Thus, the copy-in becomes invisible to the observer. Note that, in the case where the insulating film having a high light absorption property is applied, there is an effect in that the reflecting light is suppressed and the reflection of light is prevented, as compared with the case where the surface of the cathode is made to be uneven.

Further, since it is unnecessary to use the circular deflection film and the polarization plate, there is no case where the emitted light is absorbed. Thus, the brightness recognized by the observer is improved. Also, since it is unnecessary to use the circular deflection film and the polarization plate, cost can be reduced.

What is claimed is:

1. A light emitting device comprising:
a thin film transistor over a substrate;
an interlayer insulating film over the thin film transistor;
at least a transparent protrusion over the interlayer insulating film;
a first electrode over the transparent protrusion;
an organic layer over the first electrode and in contact with a portion of the first electrode; and
a second electrode over the organic layer.

2. A light emitting device according to claim 1, wherein the first electrode has a property of transmitting light.

3. A light emitting device according to claim 1, wherein the first electrode is overlapped with a plurality of transparent protrusions including the transparent protrusion.

4. A light emitting device according to claim 1, wherein the thin film transistor is electrically connected to the first electrode.

5. A light emitting device comprising:
a thin film transistor over a substrate;
an interlayer insulating film over the thin film transistor;
at least a protrusion having a property of transmitting light over the interlayer insulating film;
a first electrode over the protrusion having the property of transmitting light;
an organic layer over the first electrode and in contact with a portion of the first electrode; and
a second electrode over the organic layer.

6. A light emitting device according to claim 5, wherein the first electrode has a property of transmitting light.

7. A light emitting device according to claim 5, wherein the first electrode is overlapped with a plurality of protrusions each having a property of transmitting light including the protrusion having the property of transmitting light.

8. A light emitting device according to claim 5, wherein the thin film transistor is electrically connected to the first electrode.

9. A light emitting device comprising:
a thin film transistor including a gate insulating film over a substrate;
at least a transparent protrusion over the gate insulating film;
a first electrode over the transparent protrusion;
an organic layer over the first electrode and in contact with a portion of the first electrode; and
a second electrode over the organic layer.

10. A light emitting device according to claim 9, wherein the first electrode has a property of transmitting light.

11. A light emitting device according to claim 9, wherein the first electrode is overlapped with a plurality of transparent protrusions including the transparent protrusion.

12. A light emitting device according to claim 9, wherein the thin film transistor is electrically connected to the first electrode.

13. A light emitting device comprising:
a thin film transistor over an underlying film;
at least a transparent protrusion over the underlying film;
a first electrode over the transparent protrusion;
an organic layer over the first electrode and in contact with a portion of the first electrode; and
a second electrode over the organic layer.

14. A light emitting device according to claim 13, wherein the first electrode has a property of transmitting light.

15. A light emitting device according to claim 13, wherein the first electrode is overlapped with a plurality of transparent protrusions including the transparent protrusion.

16. A light emitting device according to claim 13, wherein the thin film transistor is electrically connected to the first electrode.

17. A light emitting device comprising:
at least a transparent protrusion;
a first electrode having an uneven surface due to the transparent protrusion;

an organic layer over the first electrode and in contact with a portion of the first electrode; and a second electrode over the organic layer.

18. A light emitting device according to claim 17, wherein the first electrode has a property of transmitting light.

19. A light emitting device according to claim 17, wherein the first electrode is overlapped with a plurality of transparent protrusions including the transparent protrusion.

20. A light emitting device comprising:

at least a protrusion having a property of transmitting light;

a first electrode having an uneven surface due to the protrusion having the property of transmitting light;

an organic layer over the first electrode and in contact with a portion of the first electrode; and a second electrode over the organic layer.

21. A light emitting device according to claim 20, wherein the first electrode has a property of transmitting light.

22. A light emitting device according to claim 20, wherein the first electrode is overlapped with a plurality of protrusions each having a property of transmitting light including the protrusion having the property of transmitting light.

23. A light emitting device comprising:

at least a layer containing a transparent material;

a first electrode having an uneven surface due to the layer containing the transparent material;

an organic layer over the first electrode and in contact with a portion of the first electrode; and a second electrode over the organic layer.

24. A light emitting device according to claim 23, wherein the first electrode has a property of transmitting light.

25. A light emitting device according to claim 23, wherein the first electrode is overlapped with a plurality of layers each containing a transparent material including the layer containing the transparent material.

26. A light emitting device comprising:

at least a layer having a property of transmitting light;

a first electrode having an uneven surface due to the layer having the property of transmitting light;

an organic layer over the first electrode and in contact with a portion of the first electrode; and a second electrode over the organic layer.

27. A light emitting device according to claim 26, wherein the first electrode has a property of transmitting light.

28. A light emitting device according to claim 26, wherein the first electrode is overlapped with a plurality of layers each having a property of transmitting light including the layer having the property of transmitting light.

* * * * *